(12) United States Patent
Mishra et al.

(10) Patent No.: US 10,224,401 B2
(45) Date of Patent: Mar. 5, 2019

(54) III-NITRIDE DEVICES INCLUDING A GRADED DEPLETING LAYER

(71) Applicant: Transphorm Inc., Goleta, CA (US)

(72) Inventors: Umesh Mishra, Montecito, CA (US);
Rakesh K. Lal, Isla Vista, CA (US);
Geetak Gupta, Goleta, CA (US); Carl Joseph Neufeld, Goleta, CA (US);
David Rhodes, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 15/564,498

(22) PCT Filed: May 31, 2017

(86) PCT No.: PCT/US2017/035254
§ 371 (c)(1),
(2) Date: Oct. 5, 2017

(87) PCT Pub. No.: WO2017/210323
PCT Pub. Date: Dec. 7, 2017

(65) Prior Publication Data
US 2018/0158909 A1 Jun. 7, 2018

Related U.S. Application Data

(60) Provisional application No. 62/343,782, filed on May 31, 2016.

(51) Int. Cl.
*H01L 29/00* (2006.01)
*H01L 23/495* (2006.01)
(Continued)

(52) U.S. Cl.
CPC ...... *H01L 29/0688* (2013.01); *H01L 29/0619* (2013.01); *H01L 29/2003* (2013.01);
(Continued)

(58) Field of Classification Search
CPC .............. H01L 23/49562; H01L 23/66; H01L 23/3738; H01L 29/0688; H01L 29/2003;
(Continued)

(56) References Cited

U.S. PATENT DOCUMENTS 4,300,091 A  11/1981  Schade, Jr.
4,532,439 A  7/1985  Koike
(Continued)

FOREIGN PATENT DOCUMENTS

CN  1596477  3/2005
CN  1748320  3/2006
(Continued)

OTHER PUBLICATIONS

Han et al., "Dependence of the fundamental band gap of AlxGa1-xN on alloy composition and pressure", 1999, Journal Applied Physics, vol. 85, No. 12, pp. 8505-8507 (Jun. 2199).*
(Continued)

*Primary Examiner* — Nikolay Yushin
(74) *Attorney, Agent, or Firm* — Fish & Richardson P.C.

(57) ABSTRACT

A III-N device includes a III-N layer structure including a III-N channel layer, a III-N barrier layer over the III-N channel layer, and a graded III-N layer over the III-N barrier layer having a first side adjacent to the III-N barrier layer and a second side opposite the first side; a first power electrode and a second power electrode; and a gate between the first and second power electrodes, the gate being over the III-N layer structure. A composition of the graded III-N layer is graded so the bandgap of the graded III-N layer adjacent to the first side is greater than the bandgap of the graded III-N layer adjacent to the second side. A region of the graded III-N layer is (i) between the gate and the second
(Continued)

power electrode, and (ii) electrically connected to the first power electrode and electrically isolated from the second power electrode.

24 Claims, 12 Drawing Sheets

(51) Int. Cl.
| | |
|---|---|
| H01L 29/06 | (2006.01) |
| H01L 29/417 | (2006.01) |
| H01L 29/423 | (2006.01) |
| H01L 29/66 | (2006.01) |
| H01L 29/778 | (2006.01) |
| H01L 29/872 | (2006.01) |
| H01L 29/20 | (2006.01) |
| H01L 29/205 | (2006.01) |
| H01L 29/40 | (2006.01) |
| H01L 29/10 | (2006.01) |

(52) U.S. Cl.
CPC .......... *H01L 29/205* (2013.01); *H01L 29/402* (2013.01); *H01L 29/408* (2013.01); *H01L 29/41766* (2013.01); *H01L 29/4236* (2013.01); *H01L 29/66462* (2013.01); *H01L 29/7785* (2013.01); *H01L 29/7786* (2013.01); *H01L 29/872* (2013.01); *H01L 23/49562* (2013.01); *H01L 29/1066* (2013.01); *H01L 29/1075* (2013.01)

(58) Field of Classification Search
CPC ... H01L 29/205; H01L 29/402; H01L 29/408; H01L 29/4236; H01L 29/66462; H01L 29/7785; H01L 29/872
See application file for complete search history.

(56) References Cited

U.S. PATENT DOCUMENTS

| | | | |
|---|---|---|---|
| 4,645,562 A | 2/1987 | Liao et al. |
| 4,665,508 A | 5/1987 | Chang |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,633,195 B2 | 10/2003 | Baudelot et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,914,273 B2 | 7/2005 | Ren et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,038,252 B2 | 5/2006 | Saito et al. |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,199,640 B2 | 4/2007 | De Cremoux et al. |
| 7,217,960 B2 | 5/2007 | Ueno et al. |
| 7,230,284 B2 | 6/2007 | Parikh et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,382,001 B2 | 6/2008 | Beach |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Lee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,465,997 B2 | 12/2008 | Kinzer et al. |
| 7,482,788 B2 | 1/2009 | Yang |
| 7,488,992 B2 | 2/2009 | Robinson |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,548,112 B2 | 6/2009 | Sheppard |
| 7,550,781 B2 | 6/2009 | Kinzer et al. |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |

(56) References Cited

U.S. PATENT DOCUMENTS

| | | |
|---|---|---|
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,811,872 B2 | 10/2010 | Hoshi et al. |
| 7,812,369 B2 | 10/2010 | Chini et al. |
| 7,834,380 B2 | 11/2010 | Ueda et al. |
| 7,851,825 B2 | 12/2010 | Suh et al. |
| 7,855,401 B2 | 12/2010 | Sheppard et al. |
| 7,859,014 B2 | 12/2010 | Nakayama et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |
| 7,935,985 B2 | 5/2011 | Mishra et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,956,383 B2 | 6/2011 | Kuroda et al. |
| 7,960,756 B2 | 6/2011 | Sheppard et al. |
| 7,961,482 B2 | 6/2011 | Ribarich |
| 7,965,126 B2 | 6/2011 | Honea et al. |
| 7,973,335 B2 | 7/2011 | Okamoto et al. |
| 7,982,242 B2 | 7/2011 | Goto |
| 7,985,986 B2 | 7/2011 | Heikman et al. |
| 7,985,987 B2 | 7/2011 | Kaneko |
| 8,039,352 B2 | 10/2011 | Mishra et al. |
| 8,044,380 B2 | 10/2011 | Lee |
| 8,049,252 B2 | 11/2011 | Smith et al. |
| 8,076,698 B2 | 12/2011 | Ueda et al. |
| 8,076,699 B2 | 12/2011 | Chen et al. |
| 8,093,606 B2 | 1/2012 | Sonobe et al. |
| 8,110,425 B2 | 2/2012 | Yun |
| 8,114,717 B2 | 2/2012 | Palacios et al. |
| 8,153,515 B2 | 4/2012 | Saxler |
| 8,174,048 B2 | 5/2012 | Beach |
| 8,178,900 B2 | 5/2012 | Kurachi et al. |
| 8,223,458 B2 | 7/2012 | Mochizuki et al. |
| 8,237,196 B2 | 8/2012 | Saito |
| 8,237,198 B2 | 8/2012 | Wu et al. |
| 8,264,003 B2 | 9/2012 | Herman |
| 8,361,816 B2 | 1/2013 | Lee et al. |
| 8,363,437 B2 | 1/2013 | Wang et al. |
| 8,389,975 B2 | 3/2013 | Kikuchi et al. |
| 8,389,977 B2 | 3/2013 | Chu et al. |
| 8,390,000 B2 | 3/2013 | Chu et al. |
| 8,404,042 B2 | 3/2013 | Mizuhara et al. |
| 8,431,960 B2 | 4/2013 | Beach et al. |
| 8,455,885 B2 | 6/2013 | Keller et al. |
| 8,471,267 B2 | 6/2013 | Hayashi et al. |
| 8,476,125 B2 | 7/2013 | Khan et al. |
| 8,492,779 B2 | 7/2013 | Lee |
| 8,502,323 B2 | 8/2013 | Chen |
| 8,519,438 B2 | 8/2013 | Mishra et al. |
| 8,525,231 B2 | 9/2013 | Park et al. |
| 8,530,904 B2 | 9/2013 | Treu et al. |
| 8,598,937 B2 | 12/2013 | Lal et al. |
| 8,603,880 B2 | 12/2013 | Yamada |
| 8,614,460 B2 | 12/2013 | Matsushita |
| 8,652,948 B2 | 2/2014 | Horie et al. |
| 8,674,407 B2 | 3/2014 | Ando et al. |
| 8,698,198 B2 | 4/2014 | Kuraguchi |
| 8,716,141 B2 | 5/2014 | Dora et al. |
| 8,742,460 B2 | 6/2014 | Mishra et al. |
| 8,772,832 B2 | 7/2014 | Boutros |
| 8,785,305 B2 | 7/2014 | Ramdani |
| 8,803,246 B2 | 8/2014 | Wu et al. |
| 8,816,396 B2 * | 8/2014 | Hwang ............... H01L 29/7786 257/194 |
| 9,443,938 B2 * | 9/2016 | Mishra ................ H01L 29/2003 |
| 2003/0006437 A1 | 1/2003 | Mizuta et al. |
| 2003/0030056 A1 | 2/2003 | Callaway, Jr. |
| 2004/0119067 A1 | 6/2004 | Weeks, Jr. et al. |
| 2005/0133816 A1 | 6/2005 | Fan et al. |
| 2005/0189559 A1 | 9/2005 | Saito et al. |
| 2006/0076677 A1 | 4/2006 | Daubenspeck et al. |
| 2006/0145189 A1 | 7/2006 | Beach |
| 2006/0189109 A1 | 8/2006 | Fitzgerald |
| 2006/0202272 A1 | 9/2006 | Wu et al. |
| 2006/0226442 A1 | 10/2006 | Zhang et al. |
| 2007/0018199 A1 | 1/2007 | Sheppard et al. |
| 2007/0045670 A1 | 3/2007 | Kuraguchi |
| 2007/0128743 A1 | 6/2007 | Huang et al. |
| 2007/0131968 A1 | 6/2007 | Morita et al. |
| 2007/0145417 A1 | 6/2007 | Brar et al. |
| 2007/0205433 A1 | 9/2007 | Parikh et al. |
| 2007/0210329 A1 | 9/2007 | Goto |
| 2007/0228477 A1 | 10/2007 | Suzuki et al. |
| 2007/0249119 A1 | 10/2007 | Saito |
| 2007/0295985 A1 | 12/2007 | Weeks, Jr. et al. |
| 2008/0073670 A1 | 3/2008 | Yang et al. |
| 2008/0272397 A1 | 11/2008 | Koudymov et al. |
| 2008/0308813 A1 | 12/2008 | Suh et al. |
| 2009/0045438 A1 | 2/2009 | Inoue et al. |
| 2009/0050936 A1 | 2/2009 | Oka |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0140262 A1 | 6/2009 | Ohki et al. |
| 2010/0044752 A1 | 2/2010 | Marui |
| 2010/0065923 A1 | 3/2010 | Charles et al. |
| 2010/0133506 A1 | 6/2010 | Nakanishi et al. |
| 2010/0203234 A1 | 8/2010 | Anderson et al. |
| 2010/0219445 A1 | 9/2010 | Yokoyama et al. |
| 2011/0012110 A1 | 1/2011 | Sazawa et al. |
| 2012/0086049 A1 | 4/2012 | Hwang et al. |
| 2012/0217512 A1 | 8/2012 | Renaud |
| 2012/0267637 A1 | 10/2012 | Jeon et al. |
| 2013/0056744 A1 | 3/2013 | Mishra et al. |
| 2013/0328061 A1 | 12/2013 | Chu et al. |
| 2014/0084346 A1 | 3/2014 | Tajiri |
| 2014/0099757 A1 | 4/2014 | Parikh et al. |
| 2014/0264370 A1 | 9/2014 | Keller et al. |
| 2014/0264455 A1 | 9/2014 | Keller et al. |
| 2015/0021552 A1 | 1/2015 | Mishra et al. |

FOREIGN PATENT DOCUMENTS

| | | |
|---|---|---|
| CN | 101107713 | 1/2008 |
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 09-306926 | 11/1997 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-253620 | 9/2004 |
| JP | 2004-260114 | 9/2004 |
| JP | 2006-032749 | 2/2006 |
| JP | 2006-033723 | 2/2006 |

(56) References Cited

FOREIGN PATENT DOCUMENTS

| | | |
|---|---|---|
| JP | 2007-036218 | 2/2007 |
| JP | 2007-505501 | 3/2007 |
| JP | 2007-215331 | 8/2007 |
| JP | 2008-091699 | 4/2008 |
| JP | 2008-199771 | 8/2008 |
| JP | 2008-243848 | 10/2008 |
| JP | 2009-503815 | 1/2009 |
| JP | 2009-524242 | 6/2009 |
| JP | 2010-087076 | 4/2010 |
| JP | 2010-525023 | 7/2010 |
| JP | 2010-539712 | 12/2010 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Chung Keun Lee, International Search Report and Written Opinion in PCT/US2008/076030, dated Mar. 23, 2009, 10 pages.
Authorized officer Yolaine Cussac, International Preliminary Report on Patentability in PCT/US2008/076030, dated Mar. 25, 2010, 5 pages.
Authorized officer Chung Keun Lee, International Search Report and Written Opinion in PCT/US2008/076079, dated Mar. 20, 2009, 11 pages.
Authorized officer Nora Lindner, International Preliminary Report on Patentability in PCT/US2008/076079, dated Apr. 1, 2010, 6 pages.
Authorized officer Keon Hyeong Kim, International Search Report and Written Opinion in PCT/US2008/076160 dated Mar. 18, 2009, 11 pages.
Authorized officer Simin Baharlou, International Preliminary Report on Patentability in PCT/US2008/076160, dated Mar. 25, 2010, 6 pages.
Authorized officer Chung Keun Lee, International Search Report and Written Opinion in PCT/US2008/076199, dated Mar. 24, 2009, 11 pages.
Authorized officer Dorothée Mülhausen, International Preliminary Report on Patentability in PCT/US2008/076199, dated Apr. 1, 2010, 6 pages.
Authorized officer Keon Hyeong Kim, International Search Report and Written Opinion in PCT/US2008/085031, dated Jun. 24, 2009, 11 pages.
Authorized officer Yolaine Cussac, International Preliminary Report on Patentability in PCT/US2008/085031, dated Jun. 24, 2010, 6 pages.
Authorized officer Tae Hoon Kim, International Search Report and Written Opinion in PCT/US2009/041304, dated Dec. 18, 2009, 13 pages.
Authorized officer Dorothée Mülhausen, International Preliminary Report on Patentability, in PCT/US2009/041304, dated Nov. 4, 2010, 8 pages.
Authorized officer Sung Hee Kim, International Search Report and the Written Opinion in PCT/US2009/057554, dated May 10, 2010, 13 pages.
Authorized Officer Gijsbertus Beijer, International Preliminary Report on Patentability in PCT/US2009/057554, dated Mar. 29, 2011, 7 pages.
Authorized officer Cheon Whan Cho, International Search Report and Written Opinion in PCT/US2009/066647, dated Jul. 1, 2010, 16 pages.
Authorized officer Athina Nikitas-Etienne, International Preliminary Report on Patentability in PCT/US2009/066647, dated Jun. 23, 2011, 12 pages.
Authorized officer Sung Chan Chung, International Search Report and Written Opinion for PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 6 pages.
Authorized officer Sang Ho Lee, International Search Report and Written Opinion in PCT/US2010/034579, dated Dec. 24, 2010, 9 pages.
Authorized officer Nora Lindner, International Preliminary Report on Patentability in PCT/US2010/034579, dated Nov. 24, 2011, 7 pages.
Authorized officer Jeongmin Choi, International Search Report and Written Opinion in PCT/US2010/046193, dated Apr. 26, 2011, 13 pages.
Authorized officer Philippe Bécamel, International Preliminary Report on Patentability in PCT/US2010/046193, dated Mar. 8, 2012, 10 pages.
Authorized officer Sang Ho Lee, International Search Report and Written Opinion in PCT/US2010/059486, dated Jul. 26, 2011, 9 pages.
Authorized officer Nora Lindner, International Preliminary Report on Patentability in PCT/US2010/059486, dated Jun. 21, 2012, 6 pages.
Authorized officer Kwan Sik Sul, International Search Report and Written Opinion in PCT/US2011/063975, dated May 18, 2012, 8 pages.
Authorized officer Simin Baharlou, International Preliminary Report on Patentability in PCT/US2011/063975, dated Jun. 27, 2013, 5 pages.
Authorized officer Sang-Taek Kim, International Search Report and Written Opinion in PCT/US2011/061407, dated May 22, 2012, 10 pages.
Authorized officer Lingfei Bai, International Preliminary Report on Patentability in PCT/US2011/061407, dated Jun. 6, 2013, 7 pages.
Authorized officer Kwan Sik Sul, International Search Report and Written Opinion in PCT/US2012/023160, dated May 24, 2012, 9 pages.
Authorized officer Simin Baharlou, International Preliminary Report on Patentability in PCT/US2012/023160, dated Aug. 15, 2013, 6 pages.
Authorized officer Jeongmin Choi, International Search Report and Written Opinion in PCT/US2012/027146, dated Sep. 24, 2012, 12 pages.
Authorized officer Athina Nickitas-Etienne, International Preliminary Report on Patentability in PCT/US2012/027146, dated Sep. 19, 2013, 9 pages.
Authorized officer Tae Hoon Kim, International Search Report and Written Opinion in PCT/US2013/035837, dated Jul. 30, 2013, 9 pages.

(56) References Cited

OTHER PUBLICATIONS

Authorized officer Agnès Wittmann-Regis, International Preliminary Report on Patentability in PCT/US2013/035837, dated Oct. 23, 2014, 6 pages.
Authorized officer Sang Won Choi, International Search Report and Written Opinion in PCT/US2013/048275, dated Oct. 14, 2013, 17 pages.
Authorized officer Simin Baharlou, International Preliminary Report on Patentability in PCT/US2013/048275, dated Jan. 8, 2015, 14 pages.
Authorized officer Hye Lyun Park, International Search Report and Written Opinion in PCT/US2013/050914, dated Oct. 18, 2013, 11 pages.
Authorized officer Yukari Nakamura, International Preliminary Report on Patentability in PCT/US2013/050914, dated Jan. 29, 2015, 8 pages.
Authorized officer Sang Won Choi, International Search Report and Written Opinion in PCT/US2013/024470, dated May 27, 2013, 12 pages.
Authorized officer Simin Baharlou, International Preliminary Report on Patentability in PCT/US2013/024470, dated Aug. 14, 2014, 9 pages.
Authorized officer June Young Son, International Search Report and Written Opinion in PCT/US2014/016298, dated May 23, 2014, 15 pages.
Authorized officer Kihwan Moon, International Preliminary Report on Patentability in PCT/US2014/016298, dated Aug. 27, 2015, 12 pages.
Authorized officer Tae Hoon Kim, International Search Report and Written Opinion in PCT/US2014/027523, dated Jul. 30, 2014, 14 pages.
Authorized officer Nora Lindner, International Preliminary Report on Patentability in PCT/US2014/027523, dated Sep. 24, 2015, 11 pages.
Authorized officer June Young Son, International Search Report and Written Opinion in PCT/US2014/024191, dated Aug. 7, 2014, 11 pages.
Authorized officer Kihwan Moon, International Preliminary Report on Patentability in PCT/US2014/024191, dated Sep. 24, 2015, 8 pages.
Authorized officer June Young Son, International Search Report and Written Opinion in PCT/US2014/046030, dated Oct. 21, 2014, 12 pages.
Authorized officer Agnès Wittmann-Regis, International Preliminary Report on Patentability in PCT/US2014/046030, dated Jan. 28, 2016, 9 pages.
European Search Report in Application No. 10 81 5813.0, dated Mar. 12, 2013, 9 pages.
Search Report and Action in TW Application No. 098132132, dated Dec. 6, 2012, 8 pages.
Search Report and Action in TW Application No. 098141930, dated Jul. 10, 2014, 7 pages.
Chinese First Office Action for Application No. 200880120050.6, dated Aug. 2, 2011, 10 pages.
Chinese First Office Action for Application No. 200980114639.X, dated May 14, 2012, 13 pages.
Ando et al., "10-W/mm AlGaN—GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H—SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN—GaN Junctions with Ultrathin AlN Interlayers: Expanding Heterojunction Design," Applied Physics Letters, 2002, 80(23):4387-4389.
Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage," Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(111): Stress Control and Application to Filed-effect Transistors," Journal of Applied Physics, 2001, 89(12):7846-7851.

(56) References Cited

OTHER PUBLICATIONS

Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Oka and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, DRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
Tracy Frost, "Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(111) Using Low-temperature AlN Interlayers," Journal of Crystal Growth, 2003, 248:563-567.
Saito et al., "Recessed-gate Structure Approach Toward Normally Off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.
Sugiura et al., "Enhancement-mode n-channel GaN MOSFETs Fabricated on p-GaN Using $HfO_2$ as Gate Oxide," Electronics Letters, 2007, vol. 43, No. 17, 2 pages.
Suh et al. "High-Breakdown Enhancement-mode AlGaN/GaN HEMTs with Integrated Slant Field-Plate," Electron Devices Meeting, 2006, IEDM '06 International, 3 pages.
Tipirneni et al. "Silicon Dioxide-encapsulated High-Voltage AlGaN/GaN HFETs for Power-Switching Applications," IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.
Wang et al., "Enhancement-mode $Si_3N_4$/AlGaN/GaN MISHFETs," IEEE Electron Device Letters, 2006, 27(10):793-795.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1 MHz," Electronic Device Letters, 2008, IEEE, 29(8):824-826.
Yoshida, "AlGan/GaN Power FET," Furukawa Review, 2002, 21:7-11.
Zhang, "High Voltage GaN HEMTs with Low On-resistance for Switching Applications," PhD Thesis, University of California, Santa Barbara, Sep. 2002, 166 pages.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.
Authorized officer Ausra Kaveckaite, International Search Report/Written Opinion in PCT/US2017/035254 dated Aug. 1, 2017, 19 pages.

\* cited by examiner

III-NITRIDE DEVICES INCLUDING A GRADED DEPLETING LAYER

CROSS-REFERENCE TO RELATED APPLICATIONS

This application is a U.S. National Stage of International Application No. PCT/US2017/035254, filed May 31, 2017, which claims the benefit under 35 U.S.C. § 119(e) of U.S. Provisional Application No. 62/343,782, filed May 31, 2016. The disclosure of the foregoing applications are incorporated herein by reference in their entirety for all purposes.

TECHNICAL FIELD

This specification relates to semiconductor devices, in particular III-Nitride transistors.

BACKGROUND

Currently, typical power semiconductor devices, including devices such as high-voltage P-I-N diodes, power MOSFETs and insulated gate bipolar transistors (IGBTs), are fabricated with silicon (Si) semiconductor material. More recently, silicon carbide (SiC) power devices have been considered due to their superior properties. III-Nitride or III-N semiconductor devices, such as gallium nitride (GaN) devices, are now emerging as attractive candidates to carry large currents, support high voltages and to provide very low on-resistance and fast switching times. Although high voltage III-N diodes, transistors and switches are beginning to be commercialized, further improvements are needed in order to improve the efficiency and output characteristics of the devices. The term device will be used in general for any transistor or switch or diode when there is no need to distinguish between them.

SUMMARY

Described herein are III-Nitride transistors and other devices having a source-connected field plate contacting a graded III-N layer that is between the gate and drain of the transistor and is electrically isolated from (i.e., not electrically connected to) the drain. The device structures can be configured to have very high breakdown voltages while maintaining a small separation between the gate and the drain. The details of one or more embodiments of the subject matter described in this specification are set forth in the accompanying drawings and the description below. Other features, aspects, and advantages of the subject matter will become apparent from the description, the drawings, and the claims.

In a first aspect, a III-N device is described. The III-N devices comprises a III-N layer structure comprising a III-N channel layer, a III-N barrier layer over the III-N channel layer, and a graded III-N layer over the III-N barrier layer, the graded III-N layer having a first side adjacent to the III-N barrier layer and a second side opposite the first side. The III-N device further comprises a first power electrode and a second power electrode and a gate between the first power electrode and the second power electrode, the gate being over the III-N layer structure. A composition of the graded III-N layer is graded such that the bandgap of the graded III-N layer adjacent to the first side is greater than the bandgap of the graded III-N layer adjacent to the second side. The graded III-N layer further includes a region that is between the gate and the second power electrode, and is electrically connected to the first power electrode and electrically isolated from the second power electrode.

In a second aspect, a transistor is described. The transistor comprises a III-N layer structure comprising a III-N channel layer, a III-N barrier layer over the III-N channel layer, a first graded III-N layer over the III-N barrier layer, and a second graded III-N layer over the first graded III-N layer, the second graded III-N layer being thinner than the first graded III-N layer. The transistor further comprises a source electrode and a drain electrode and a gate between the source electrode and the drain electrode, the gate being over the III-N layer structure. The first graded III-N layer has a first side adjacent to the III-N barrier layer and a second side opposite the first side, and the second graded III-N layer has a third side adjacent to the first graded III-N layer and a fourth side opposite the third side. The composition of the first graded layer is graded at a first average rate from the first side to the second side such that the bandgap of the first graded III-N layer at the first side is greater than the bandgap of the first graded III-N layer at the second side. The composition of the second graded III-N layer is graded at a second average rate from the third side to the fourth side such that the bandgap of the second graded III-N layer at the third side is greater than the bandgap of the second graded III-N layer at the fourth side, and the second average rate is greater than the first average rate.

In a third aspect, another III-N device is described. The III-N device comprises a III-N layer structure comprising a III-N barrier layer adjacent to a III-N channel layer, where a compositional difference between the III-N channel layer and the III-N barrier layer causes a 2DEG channel to be induced in the III-N channel layer. The III-N device further comprises a first power electrode and a second power electrode where the first and second power electrodes are electrically connected to the 2DEG channel. The III-N device comprises a gate electrode over the III-N channel layer and between the first power electrode and the second power electrode. The III-N device further comprises a graded III-N layer over the III-N layer structure and between the gate electrode and the second power electrode, the graded III-N layer having a first side adjacent to the III-N layer structure and a second side opposite the first side. The III-N device also comprises a p-doped III-N layer over the graded III-N layer, the p-doped layer having a third side contacting the second side of the graded III-N layer and a fourth side opposite the third side, where a composition of the graded III-N layer is graded such that the bandgap of the graded III-N layer adjacent to the first side is greater than the bandgap of the graded III-N layer adjacent the second side, and an area of the third side of the p-doped III-N layer is less than an area of the second side of the graded III-N layer.

In a fourth aspect, a transistor is described. The transistor comprises a III-N layer structure comprising a III-N channel layer between a III-N barrier layer and a graded III-N layer. The transistor further comprises a source and a drain, and a gate between the source and the drain, the gate being over the III-N layer structure. The transistor further comprises a channel in the III-N channel layer, the channel extending from the source to the drain when the gate is biased relative to the source at a voltage which is higher than a threshold voltage of the transistor, where the graded III-N layer is electrically connected to the source and electrically isolated from the drain.

In a fifth aspect, a transistor is described. The transistor comprises a III-N layer structure comprising a III-N channel layer and a III-N barrier layer. The transistor further comprises a 2DEG channel in the III-N channel layer. The transistor further comprises a source and a drain and a gate between the source and the drain, the gate being over the III-N layer structure. The transistor further comprises a graded III-N layer which is at least partially in an access region between the gate and the drain, where a grading profile of the graded III-N layer causes holes to be induced in at least a portion of the graded III-N layer without p-type dopants being included in the portion of the graded III-N layer. The grading profile of the graded III-N layer is configured such that mobile charge in the 2DEG channel in the access region between the gate and the drain is depleted while the gate is biased relative to the source at a voltage lower than a transistor threshold voltage and the drain is biased above a minimum voltage relative to the source, but not depleted while the gate is biased relative to the source at a voltage lower than the transistor threshold voltage and the drain is biased below the minimum voltage relative to the source.

In a sixth aspect, a III-N device is described. The III-N device comprises a II-N layer structure comprising a III-N barrier layer adjacent to a III-N channel layer, where a compositional difference between the III-N channel layer and the III-N barrier layer causes a 2DEG channel to be induced in the III-N channel layer. The III-N device further comprises a source electrode and a drain electrode, where the source electrode and the drain electrode are electrically connected to the 2DEG channel. The III-N device further comprises a graded III-N layer over the III-N layer structure, the graded III-N layer having a first side adjacent to the III-N layer structure and a second side opposite the first side. The III-N device further comprises a p-doped III-N layer over the graded III-N layer, the p-doped III-N layer having a third side contacting the second side of the graded III-N layer and a fourth side opposite the third side. The III-N device further comprises a gate electrode over the p-doped III-N layer and between the source electrode and the drain electrode, where a composition of the graded III-N layer is graded such that the bandgap of the graded III-N layer adjacent to the first side is greater than the bandgap of the graded III-N layer adjacent to the second side. The area of the third side of the p-doped III-N layer is less than an area of the second side of the graded III-N layer, and the graded III-N layer is electrically isolated from the source electrode and the drain electrode.

In a seventh aspect, a III-N device is described. The III-N device comprises a substrate and a III-N layer structure over the substrate. The III-N layer structure comprises a III-N channel layer, a III-N barrier layer over the III-N channel layer, and a graded III-N layer over the barrier layer, the graded III-N layer having a first side adjacent to the III-N barrier layer and a second side opposite the first side. The III-N device further comprises a 2DEG channel in the III-N channel layer and a first power electrode and a second power electrode. The composition of the graded III-N layer is graded such that the bandgap of the graded III-N layer adjacent to the first side is greater than the bandgap of the graded III-N layer adjacent to the second side, and the graded III-N layer is electrically isolated from the first power electrode. The grading profile of the graded III-N layer is configured such that mobile charge in the 2DEG channel under the graded III-N layer is depleted when the first power electrode is biased above a minimum voltage relative to the second power electrode, but not depleted when the first electrode is biased below a minimum voltage relative to the second power electrode.\

In an eight aspect, a III-N device encased in a package is described. The III-N devices comprises a III-N layer structure over a substrate, the III-N layer structure comprising a III-N channel layer, a III-N barrier layer over the III-N channel layer, a graded III-N layer over the III-N barrier layer, and a p-doped III-N layer over the III-N graded layer. The III-N device further comprises a first power electrode and a second power electrode, where the first power electrode is at least partially in a via formed through the III-N layer structure, and at least a portion of the second power electrode is formed in a recess in the III-N layer structure. The first power electrode is electrically isolated from both the graded III-N layer and the p-doped III-N layer, the first power electrode is electrically connected both to a 2DEG in the III-N channel layer and to the substrate. The package comprises a first lead and a second lead, the first lead is electrically connected to a conductive structural base and the second lead is electrically isolated from the conductive structural package base, the substrate of the III-N device is electrically connected to the conductive structural package base and the second power electrode of the III-N device is electrically connected to the second lead of the package.

Each of the devices, and transistors described herein can include one or more of the following features. When the gate is biased relative to the source electrode at a voltage less than the threshold voltage and the drain electrode is biased relative to the source electrode at a positive voltage that is greater than the minimum voltage, the 2DEG is depleted of mobile charge in the device access region between the gate and the drain electrode. Where the minimum voltage of the device is greater than 5V. Where the minimum voltage is in a range of 5V to 100V. The grading profile of the graded III-N layer is configured such that a polarization charge density in the graded III-N layer is in the range of 10-100% of an areal sheet charge density of mobile charge in the 2DEG channel. The device comprises a recess extending through the graded III-N layer, where the gate is in the recess. The device comprise a field plate which is connected to the first power electrode and directly contacts a surface of the graded III-N layer that is between the gate and the second power electrode. The graded III-N layer comprises a first graded III-N layer adjacent to the first side and a second graded layer adjacent to the second side, where the first graded III-N layer is thicker than the second graded III-N layer. The device comprises a first graded II-N layer that is graded at a first rate and a second graded layer is graded at a second rate, where the second rate is greater than the first rate. The device comprises a p-doped layer where the p-doped layer and the graded layer are electrically isolated form the second power electrode. Where a separation between the second power electrode and the second edge of the p-doped III-N layer is greater than a separation between the second power electrode and the second edge of the graded III-N layer. Where the separation between the graded III-N layer and the drain electrode is greater than 1 µm and less than 7 µm. Where the contact between the second power electrode and the III-N channel layer is a Schottky contact. The device is capable of supporting a voltage of 600V or greater between the first power electrode and the second power electrode, and a separation between the first power electrode and the second power electrode is less than 15 µm. The III-N layer structure of the device comprises a III-N back barrier layer having a first side adjacent the substrate and a second side adjacent the III-N channel layer, where the second side is less than 100 nm from the 2DEG channel.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \le w \le 1$, $0 \le x \le 1$, $0 \le y \le 1$, and $0 \le z \le 1$. III-N materials, layers, or devices, can be formed or prepared by either directly growing on a suitable substrate (e.g., by metal organic chemical vapor deposition), or growing on a suitable substrate, detaching from the original substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, or other suitable blocking voltage required by the application. For a bidirectional or four quadrant switch, the blocked voltage could be of any polarity less a certain maximum when the switch is OFF ($\pm V_{max}$ such as $\pm 300V$ or $\pm 600V$, $\pm 1200V$ and so on), and the current can be in either direction when the switch is ON.

As used herein, a "III-N device" is a device based on III-N heterostructures. The III-N device can be designed to operate as a transistor or switch in which the state of the device is controlled by a gate terminal or as a two terminal device that blocks current flow in one direction and conducts in another direction without a gate terminal. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, 2500V, or higher. When the high voltage device is biased on (e.g., the voltage on the gate relative to the source or associated power terminal is greater than the device threshold voltage), it is able to conduct substantial current with a low on-voltage (i.e., a low voltage between the source and drain terminals or between opposite power terminals). The maximum allowable on-voltage is the maximum on-state voltage that can be sustained in the application in which the device is used.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DESCRIPTION OF DRAWINGS

Like reference symbols in the various drawings indicate like elements.

DETAILED DESCRIPTION

Described herein are III-Nitride transistors and other devices that include a graded III-Nitride layer as a channel depleting layer. Specifically, the graded layer causes channel charge in an access region of the device to be depleted while the device is biased OFF, but not to be depleted while the device is biased ON. Such a structure allows for a compact device with a very high breakdown voltage while maintaining a low on-resistance.

Figure 1:
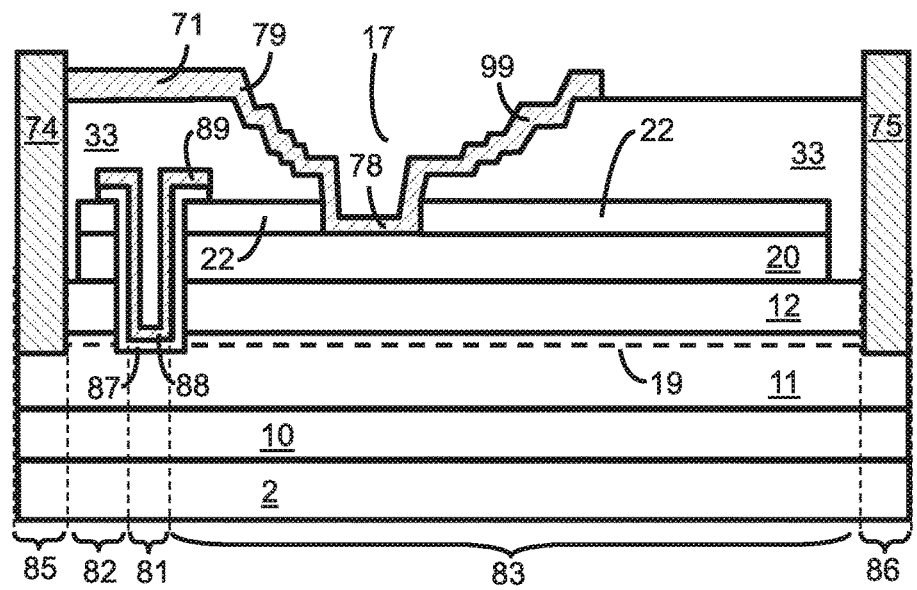
FIG. 1 is a cross-sectional view of a III-N transistor having a source-connected field plate contacting a graded III-N layer.

Referring now to FIG. 1, a transistor device of FIG. 1 includes a III-N buffer layer 10, for example GaN or AlGaN, grown on a suitable substrate 2, which can for example be silicon, silicon carbide, sapphire, AlN, or GaN. The substrate can be a polycrystalline insulating material of high thermal conductivity and low electrical conductivity on which an appropriate conducting layer is grown below the buffer layer 10. The device further includes a III-N channel layer 11, for example unintentionally doped (UID) GaN, on the III-N buffer layer 10, and a III-N barrier layer 12, for example $Al_xGa_{1-x}N$, on the III-N channel layer 11. The bandgap of the III-N barrier layer 12 is typically greater than that of the III-N channel layer 11. The III-N channel layer 11 has a different composition than the III-N barrier layer 12, the bandgap of the III-N barrier layer 12 is greater than that of the III-N channel layer 11, and the thickness and composition of III-N barrier layer 12 is selected such that a two-dimensional electron gas (2DEG) channel 19 (indicated by the dashed line in FIG. 1) is induced in the III-N channel layer 11 adjacent the interface between layers 11 and 12.

A graded III-N layer 20 is formed over the III-N barrier layer 12. The graded III-N layer 20 is at least between the gate 88 and the drain 75, and may optionally also be between the source 74 and the gate 88, as shown in FIG. 1. The graded III-N layer 20 has a composition that is graded, for example continuously graded, from the side adjacent the III-N barrier layer 12 to the side opposite the III-N barrier layer 12. The composition of the graded III-N layer 20 is selected such that the bandgap of the graded III-N layer 20 decreases (e.g., continuously decreases) from the side adjacent the III-N barrier layer 12 to the side opposite the III-N barrier layer 12, and/or the lattice constant of the graded III-N layer 20 increases (e.g., continuously increases) from the side adjacent the III-N barrier layer 12 to the side opposite the III-N barrier layer 12. For example, the graded III-N layer 20 can be formed of $Al_yGa_{1-y}N$ ($0 \le y \le 1$), where y decreases (e.g., continuously decreases) from the side adjacent the III-N barrier layer 12 to the side opposite the III-N barrier layer 12. Alternatively, the graded III-N layer 20 can be formed of $In_zGa_{1-z}N$ ($0 \le z \le 1$), where z increases (e.g., continuously increases) from the side adjacent the III-N barrier layer 12 to the side opposite the III-N barrier layer 12. Or it could be a quaternary such as $In_zAl_yGa_{1-(z+y)}N$ ($0 \le (z+y) \le 1$) where y decreases and z increases as one moves from the upper interface of the III-N barrier layer to the interface of layers 20 and 22.

The III-N layers 11, 12, and 20 can all be formed in a polar or semipolar orientation, for example a [0 0 0 1] or III-polar orientation (where the group-III face of the layer is opposite the substrate). The compositional grade in the graded III-N layer 20 causes the graded layer 20 to have a fixed negative polarization charge throughout the bulk of the layer. Specifically, because the graded III-N layer is formed from a polar material in a polar orientation (e.g., a [0 0 0 1] orientation), compositionally grading the layer as described above causes a net negative polarization charge to exist in the bulk of the layer. These negative bulk polarization charges are virtually similar to charge due to ionized acceptors, and thus the graded layer 20 will be electrically neutral if it can attract holes at a concentration equal to the concentration of bulk polarization charge throughout the layer 20. The concentration of bulk polarization charge depends on the rate at which the material is graded; a higher rate of grading results in a higher concentration of polarization charge.

The specific grading structure and thickness of the graded III-N layer 20 is selected such that channel charge in the drain side access region 83 of the transistor is substantially depleted while the transistor is biased OFF (i.e., while the gate of the transistor is biased relative to the source at a voltage lower than the transistor threshold voltage), but not depleted (i.e., is substantially electrically conductive) while the transistor is biased ON (i.e., while the gate of the transistor is biased relative to the source at a voltage higher than the transistor threshold voltage). For example, the areal polarization charge density in the graded III-N layer 20 can be in the range of 10-100% (e.g., 50-75%) of the areal sheet charge density of the electrons in the 2DEG channel 19.

An insulator layer 22 is formed over the graded III-N layer. The insulator layer 22 can, for example, be formed of an oxide or nitride such as silicon nitride, silicon oxide, aluminum nitride, aluminum oxide, or any other insulator with a large enough breakdown field. The insulator layer 22 can serve as a passivation layer, preventing voltage fluctuations at the upper surface of the III-N layers during device operation, thereby improving the stability of the device.

A gate 88 is formed in a recess that extends through insulator layer 22. The recess optionally extends at least partially through graded III-N layer 20, through the entire thickness of graded III-N layer 20, or through the entire thickness of graded III-N layer 20 and at least partially through III-N barrier layer 12 (and optionally through the entire thickness of III-N barrier layer 12). The recess may further optionally extend into the III-N channel layer 11, as shown in FIG. 1. A gate insulating layer 87 is optionally included between gate 88 and the underlying III-N layers. The gate insulating layer 87 can be formed of a single insulating material (e.g., silicon oxide or aluminum silicon oxide), or can alternatively be formed of a combination of layers of III-N material and layers of insulating material. Source and drain contacts 74 and 75, respectively, are on opposite sides of the gate 88 and contact the device 2DEG channel 19 that is formed in layer 11. The portion of the III-N materials directly below the lowermost portion of the gate 88 (in region 81) is referred to as the gate region of the device. The portions of the III-N materials directly below the source and drain 74 and 75 (regions 85 and 86) are respectively referred to as the source and drain regions of the device. The portions of III-N material between the gate region 81 and the source region 85, and between the gate region 81 and the drain region 86, are referred to as the device access regions.

As seen in FIG. 1, the recess in which the gate electrode is deposited can be formed to a sufficient depth to ensure that the device is an enhancement-mode device, such that the device has a threshold voltage greater than 0V. That is, when 0V is applied to the gate 88 relative to the source 74 and a positive voltage is applied to the drain 75 relative to the source 74, channel charge in the gate region is depleted, and the device is in a non-conductive state. When a sufficiently positive voltage higher than the threshold voltage is applied to the gate 88 relative to the source 74, the 2DEG charge in the gate region is induced, and the device becomes conductive.

Alternatively, the device in FIG. 1 can be modified to be a depletion-mode device. If the depth of the recess below the gate is decreased, then the transistor can be a depletion-mode device, where the device is ON when 0V is applied to the gate relative to the source, and a sufficiently negative voltage must be applied to the gate relative to the source to turn the device OFF. For example, the device may be a depletion-mode device if the gate recess is not included, if the recess only extends partially through the graded III-N layer 20, if the recess extends through the entire graded III-N layer 20 but does not extend into the III-N barrier layer 12, or if the recess only extends a very short distance into the III-N barrier layer 12.

An insulating high-voltage passivation electrode-defining layer 33, which can for example be formed of an oxide or nitride, is formed over insulator layer 22. Recess 17, in which a source connected field plate 79 is formed, extends through the thickness of layers 33 and 22 to expose a surface of graded layer 20, the exposed surface being in the access region 83 between the gate 88 and the drain 75. Recess 17 can include a sloped and/or stepped region over which portion 99 of field plate 79 (described below) is formed.

As further illustrated in FIG. 1, the source 74 is electrically connected to the graded III-N layer 20. For example, the device can include a field plate 79 which directly contacts the graded III-N layer 20 and is electrically connected to the source 74. For example, as seen in FIG. 1, field plate 79 is electrically connected to source 74 via portion 71, and portion 78 of field plate 79 is in the recess 17 and contacts the exposed surface of graded layer 22 between the gate 88 and the drain 75. Portion 99 of field plate 79, which is between portion 78 and drain electrode 75, is a field mitigating portion, reducing the peak electric field in the device when the device is biased in the OFF state. Although FIG. 1 shows portion 71 formed directly over the gate 88, portion 71 may alternatively be formed over an inactive region of the transistor rather than directly over the gate (not shown). As also seen in FIG. 1, the drain 75 is electrically isolated from (i.e., is not electrically connected to) the graded III-N layer 20. An encapsulation layer, such as dielectric layer, may also be formed over the entire structure.

Having a source-connected field plate 79 electrically connected to the graded III-N layer 20 can cause layer 20 to have an excess concentration of holes, and thereby behave similarly to a p-type layer, while the transistor is biased in the ON state or is not under any bias (i.e., such as when the source, gate, and drain are not biased relative to one another). That is, the source-connected field plate 79 can supply holes to the graded III-N layer 20, and the holes can be distributed throughout the layer 20 in such a way that the layer 20 (or at least a portion of the layer 20) is charge neutral or has a lower net negative charge than it would have in the absence of the holes. In some implementations, the graded III-N layer 20 is also doped with p-type dopants.

The device of FIG. 1 operates as follows. When the gate 88 is biased relative to the source 74 at a voltage that is greater than the threshold voltage of the device, there is 2DEG charge below the gate 88 in the gate region 81, and therefore a continuous 2DEG from the source 74 to the drain 75. When a positive voltage is applied to the drain 75, electrons flow from the source 74, through the continuous 2DEG channel 19, and into the drain 75. A conventional current flows from the drain 75 to the source 74, and the device is considered to be ON.

When the gate 88 is biased relative to the source 74 at a voltage that is lower than the threshold voltage of the device, there is no 2DEG in the gate region 81 below the gate 88, and therefore the 2DEG 19 is discontinuous between the source 74 and the drain 75. While no voltage (or a small positive voltage) is applied to the drain, the graded III-N layer 20 remains populated with holes that were supplied by the source-connected field plate 79. When a small positive voltage is applied to the drain 75, the portion of the 2DEG in the access region 83 between the gate 88 and the drain 75 attains substantially the same potential (i.e., substantially the same voltage) as the drain 75. The graded III-N layer 20 and the source connected field plate 79 remain at substantially the same potential as the source 74. As the voltage on the drain 75 is progressively increased, a positive electric field is created from the portion of the 2DEG in the drain-side access region that is directly beneath the graded III-N layer 20 up to the graded III-N layer 20. This causes electrons from the portion of the 2DEG 19 in the drain-side access region 83 to deplete out, and the graded III-N layer 20 is also progressively depleted of holes.

The grading profile in the graded III-N layer 20, the layer thicknesses and compositions of the III-N layers, and the corresponding (undepleted) 2DEG sheet charge density in the channel can all be selected such that, at all voltages greater than a minimum drain voltage, where the minimum drain voltage can for example be in a range of 5V and 100V, almost all or substantially all mobile carriers in the 2DEG in the drain-side access region and in the graded III-N layer 20 are depleted (mobile carriers in the 2DEG include conduction electrons, and mobile carriers in the graded III-N layer 20 include holes). Any subsequent increase in drain voltage causes charge imaging from regions in or near the drain 75 to the field plate 79 (e.g., portion 99 of the field plate). Because the graded III-N layer 20 is fully depleted, it no longer remains at ground potential, and as a result the potential (i.e., voltage) in the layer increases from the gate side to the drain side (because the layer is no longer equipotential, different parts of the layer will be at different electric potentials). There is therefore a smooth change of potential from the drain 75 to the field plate 79, and field peaking, which is commonly observed in conventional planar HEMTs, is mitigated at the edge of the field plate. This results in a more uniform electric field and thus a larger average field before breakdown occurs, thereby resulting in a larger breakdown voltage.

Figure 2:
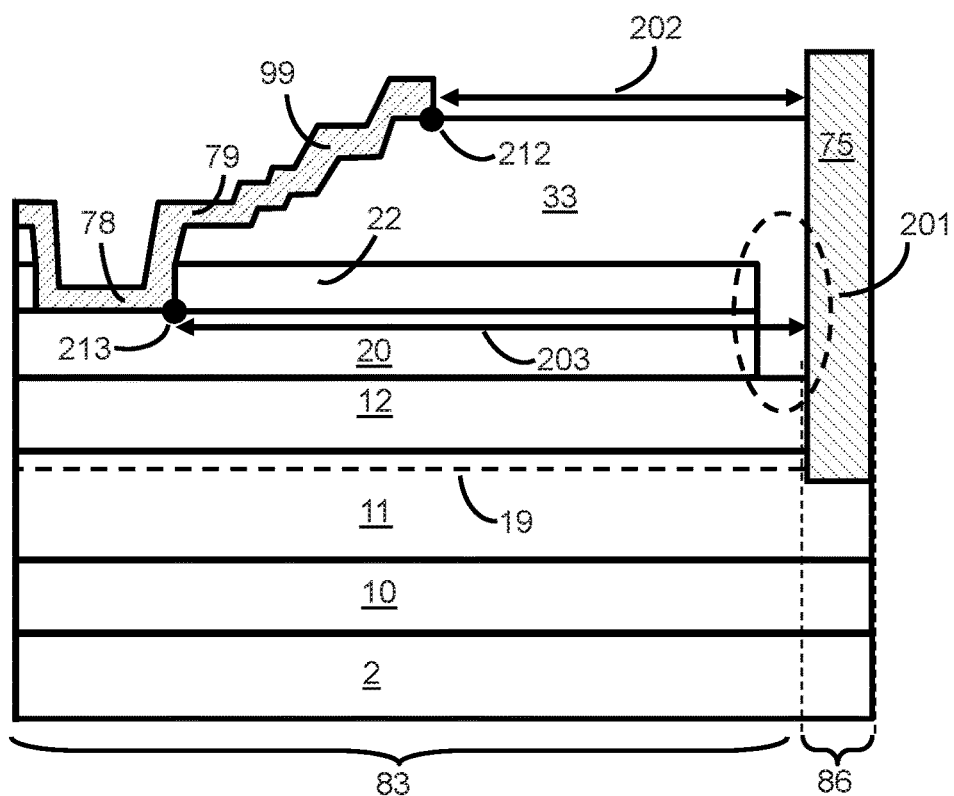
FIG. 2 illustrates a portion of the III-N transistor of FIG. 1

FIG. 2 is close-up view of portions of the device of FIG. 1, specifically of portions in the drain side access region 83 and drain contact region 86 of the device of FIG. 1. As shown in FIGS. 1 and 2 and previously described, the graded III-N layer 20 is electrically isolated from the drain 75 in order to prevent conduction between the source 74 and drain 75 through layer 20 during device operation. For example, referring to region 201 in FIG. 2, the graded III-N layer 20 can be separated from the drain 75 by including insulating material (e.g., material of electrode-defining layer 33) between the two. Furthermore, because there is typically a potential difference between the drain 75 and the edge of layer 20 adjacent to the drain 75 while the transistor is biased in the OFF state, the separation between drain 75 and layer 20 must be at least large enough to support this potential difference. Consequently, the separation between drain 75 and layer 20 can, for example, be greater than 0.1 μm, greater than 0.3 μm, greater than 0.5 μm, greater than 0.7 μm, greater than 1 μm, greater than 1.2 μm, greater than 1.4 μm, greater than 1.6 μm, greater than 2 μm, or greater than 3 μm, the spacing being determined by the $V_{MAX}$ of the device.

Furthermore, the peak electric field in the device of FIG. 1 while the device is biased in the OFF state occurs either near the drain-side edge of field plate 79 (point 212 in FIG. 2) or near the drain-side edge of portion 78 of field plate 79 (point 213 in FIG. 2). Because of the large voltage difference between the field plate 79 and the drain 75 while the device is biased in the OFF state, the separation between the drain-side edge of field plate 79 and the drain 75 (labeled 202 in FIG. 2) as well as the separation between the drain-side edge of portion 78 and the drain 75 (labeled 203 in FIG. 2) must be sufficiently large to prevent breakdown when the device is biased in the OFF state and the voltage at the drain (relative to the source) is biased at any voltage up to the maximum rated voltage of the device. However, because of the spreading of the electric field provided by the depleted 2DEG channel 19 and depleted graded layer 20 in drain access region 83, the separations 202 and 203 are much less than would otherwise be needed for a conventional device which lacks a layer (such as layer 20) that depletes the 2DEG channel in the drain access region during device OFF state operation. For example, if the device of FIG. 1 is designed (e.g., rated) to support a maximum steady-state voltage of 600V while the device is biased in the OFF state, separations 202 and 203 must typically be greater than about 7 μm, but can be less than 18 μm, for example less than 17 μm, less than 16 μm, less than 15 μm, less than 14 μm, less than 13 μm, less than 12 μm, less than 11 μm, less than 10 μm, or less than 9 μm. In conventional III-N devices in which the 2DEG channel in the drain access region is not fully depleted during OFF state device operation, the separation between the drain-side edge of the gate and the drain typically needs to be greater than 18 μm in order for the device to be able to support at least 600V while biased in the OFF state. Additionally, the separation between the gate 88 and the drain 75 for the device of FIG. 1 can be less than 18 μm, for example less than 17 μm, less than 16 μm, less than 15 μm, less than 14 μm, less than 13 μm, less than 12 μm, less than 11 μm, less than 10 μm, or less than 9 μm.

In order to allow for a compact device with high breakdown voltage, as described above, portion 78 of field plate 79 is formed closer to the gate 88 than to the drain. For example, the separation between portion 89 of gate 88 and portion 78 of field plate 79 can be less than 2 μm, and the width of portion 78 of field plate 79 can be in the range of 1 to 2 μm.

Figure 3:
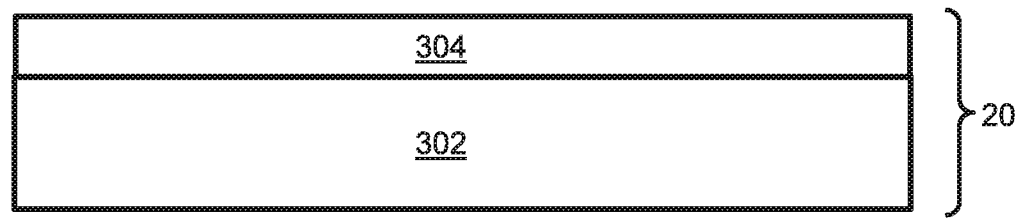
FIG. 3 is a III-N material layer structure of the graded III-N layer of FIG. 1.

In some implementations, graded layer 20 is formed as a combination of multiple layers, e.g., multiple graded layers (provided the compositional grading throughout the entire graded layer is as described above). For example, FIG. 3 shows an implementation of graded III-N layer 20 which includes a first graded III-N layer 302, and a second layer 304 having a bandgap throughout that is lower than that throughout first graded III-N layer 302. In some implementations, second layer 304 is a second graded III-N layer formed over the first graded III-N layer 302. The bandgap of the first graded III-N layer 302 is graded at a first rate, and the bandgap of the second graded III-N layer 304 is graded at a second rate. Graded III-N layers 302 and 304 can be designed such that the first graded III-N layer 302 is thicker (e.g., substantially thicker) than the second graded III-N layer 304, while the second rate is greater than the first rate. For example, layer 302 can be about 100 nm thick and have a composition graded from GaN at the bottom to $In_{0.05}Ga_{0.95}N$ at the top, while layer 304 can be about 5 nm thick and have a composition graded from $In_{0.05}Ga_{0.95}N$ at the bottom to $In_{0.25}Ga_{0.75}N$ at the top. Such a structure has been found to allow for holes to be supplied to layer 20 via an overlying metal electrode (e.g., field plate 79) without requiring any p-type dopants in the III-N material structure. Alternatively, the second layer 304 can be an abrupt heterojunction layer (e.g. an undoped GaN layer) that has a band gap that is substantially constant throughout the layer, and the bandgap of the portion of layer 304 adjacent to layer 302 is less than the bandgap of the portion of layer 302 adjacent to layer 304.

Figure 4:
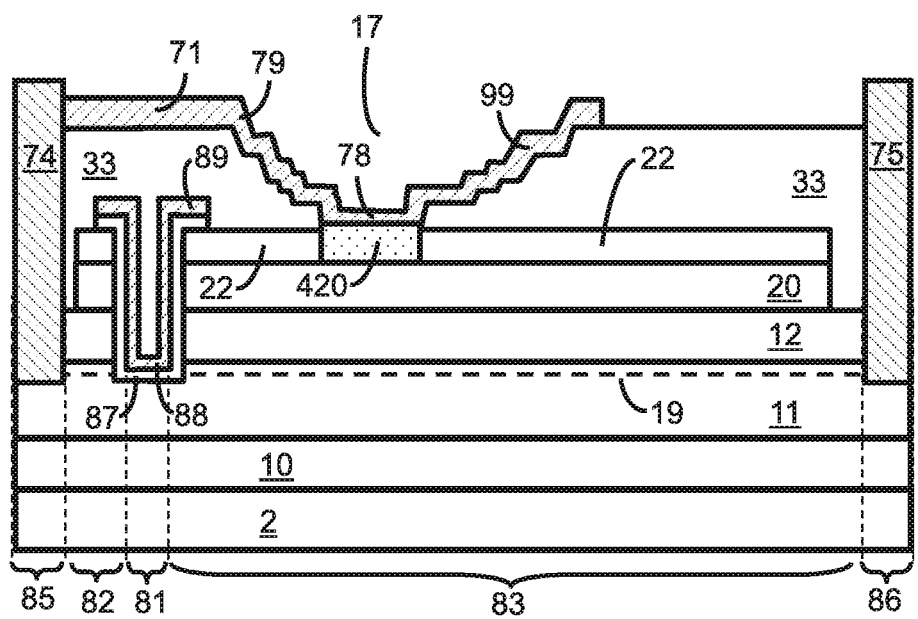
FIG. 4 is a cross-sectional view of a III-N transistor having a source-connected field plate contacting a p-doped layer which contacts a graded III-N layer.

In some other implementations, holes are supplied to graded III-N layer 20 via a p-type layer. FIG. 4 illustrates such a structure. The device of FIG. 4 is similar to that of FIG. 1, but further includes a p-doped III-N layer 420 over and contacting the graded III-N layer 20. The p-doped III-N layer 420 is doped with a hole concentration density greater than $1\times10^{18}$ holes/cm$^2$ such that it substantially not depleted of holes when biased at or below the maximum rated voltage of the device. The p-doped III-N layer 420 supplies holes to layer 20, and portion 78 of field plate 79 directly contacts the p-doped III-N layer 420. As viewed from above (plan view of the device), the area of layer 420 is less than (e.g., substantially less than) the area of layer 20. That is, layer 420 is only over and/or only covers a portion of the upper surface of layer 20. When the device of FIG. 4 is biased in the off state, holes are supplied to layer 20 via the p-doped III-N layer 420 and the required concentration of negative polarization charge in the graded layer 20 can be achieved with an abrupt heterojunction layer, for example an undoped GaN layer that has a bandgap that is less than the III-N barrier layer 12. However, hole trapping can occur at the interface of the III-N channel layer 12 and the abrupt heterojunction layer, causing transient decrease in breakdown voltage and reduced device switching speed. This makes an abrupt heterojunction layer potentially less desirable than a graded III-N layer 20. Also, the graded III-N layer 20 can lower the interface resistance between the p-doped layer 420 and the graded III-N layer 20 compared to an abrupt GaN layer.

Figure 5:
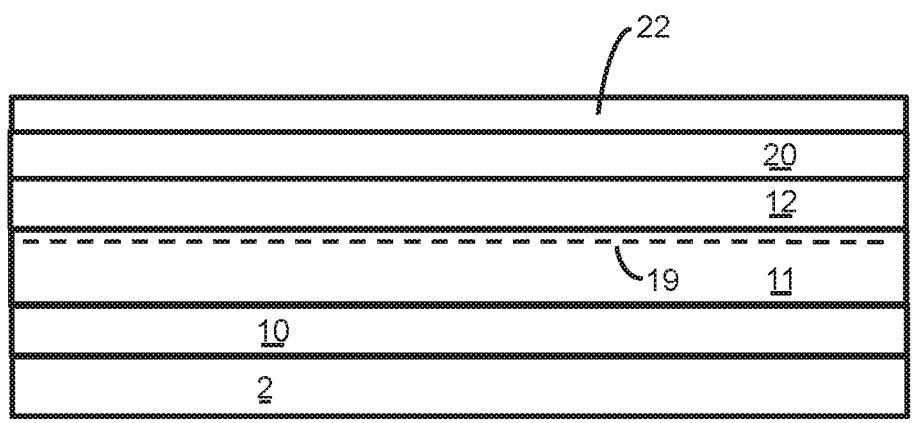
FIGS. 5-16 illustrate a method for fabricating the transistor of FIG. 1.
Figure 6:
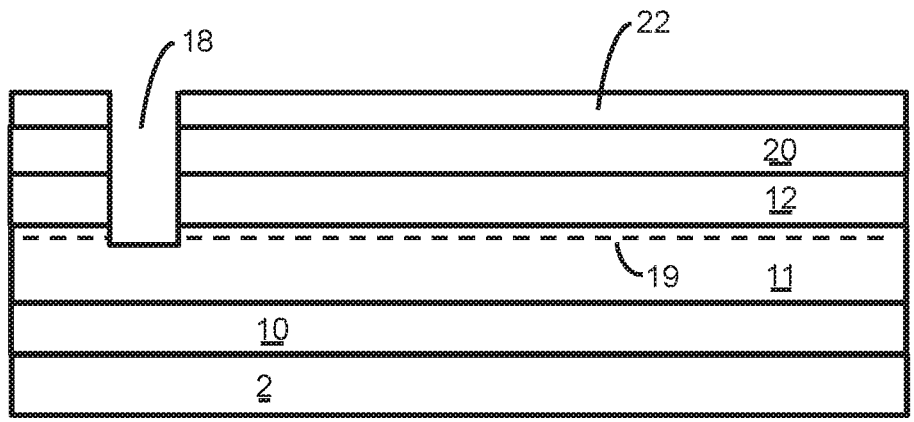

A method of forming the device of FIG. 1 is illustrated in FIGS. 5-16. Referring to FIG. 5, III-N material layers 10, 11, 12, and 20 are formed on substrate 2, for example by metalorganic chemical vapor deposition (MOCVD) or molecular beam epitaxy (MBE). Insulator layer 22, formed over the III-N material layers, is then deposited by methods such as MOCVD, plasma enhanced chemical vapor deposition (PECVD), or low pressure chemical vapor deposition (LPCVD). In some implementations, III-N material layers 10, 11, 12, and 20 and insulator layer 22 are all formed consecutively in an MOCVD reactor, without exposure to atmosphere between the formation of any of the layers. Next, as seen in FIG. 6, a recess 18 is formed in the gate region of the device. The recess 18, which can be formed using conventional lithographical and etching techniques, is achieved by etching through the insulator layer 22, and optionally into the III-N material layers. The recess can extend through graded III-N layer 20 and at least partially through III-N barrier layer 12. The recess 18 may optionally extend through the entire thickness of III-N barrier layer 12, and may also optionally extend into III-N channel layer 11 and through the 2DEG channel 19.

Figure 7:
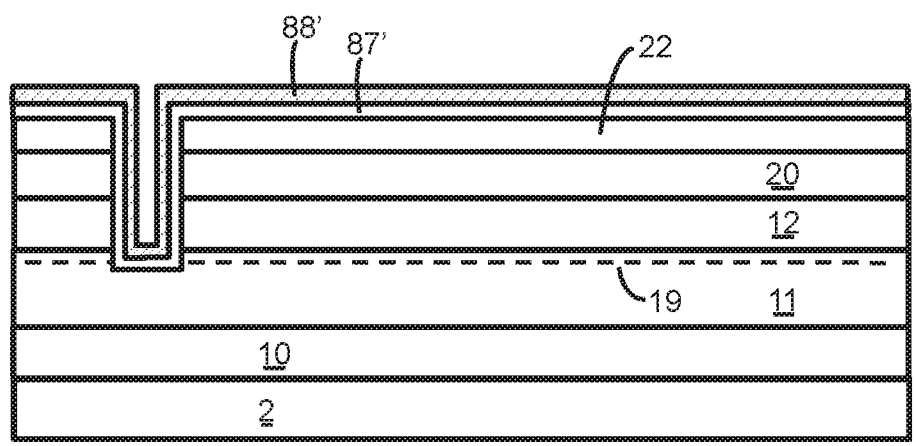

Referring to FIG. 7, a gate insulator layer 87', which for example may be formed of or include aluminum oxide, silicon oxide, aluminum silicon oxide, aluminum silicon nitride, aluminum silicon oxide nitride, silicon nitride, hafnium oxide, and/or another wide bandgap insulator, is then deposited conformally in the recess and over the upper surface of the device. As also shown in FIG. 7, after deposition of the gate insulator layer 87', a gate electrode layer 88' is deposited conformally over the gate insulator layer 87' and is at least partially in the gate region 81 (region 81 is labeled in FIG. 1) of the device.

Figure 8:
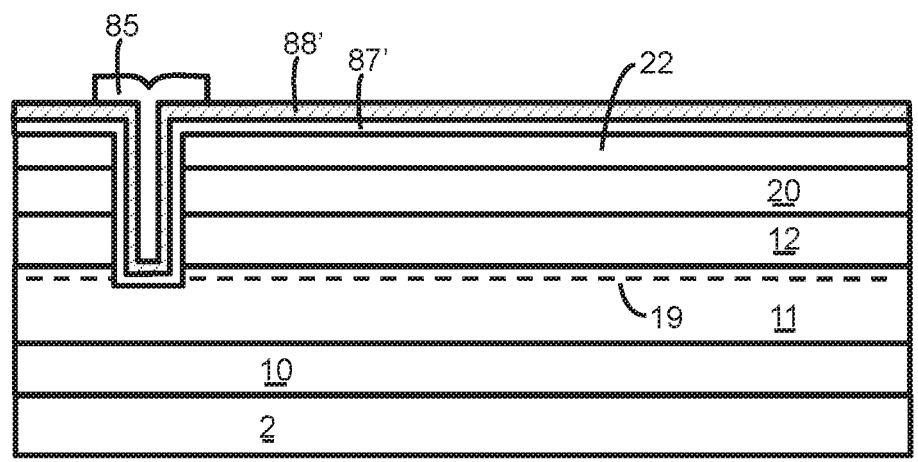
Figure 9:
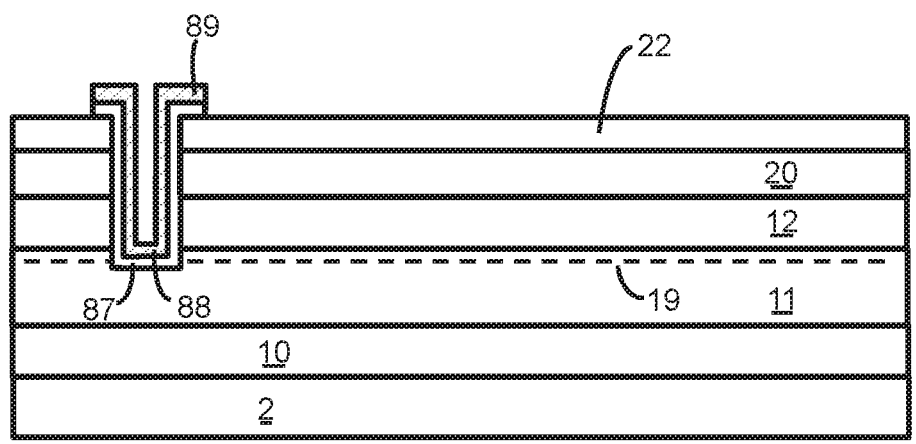

As shown in FIG. 8, a masking layer 85, for example photoresist, is then formed over the portion of gate electrode layer 88' which subsequently makes up the gate electrode of the device. The portions of layers 87' and 88' which are not underneath the masking layer 85 are then etched away, and the masking layer 85 is then removed, resulting in the structure shown in FIG. 9. As seen in FIG. 9, the gate 88 includes a main gate portion which is in the recess, as well as an extending portion 89 that is outside the recess, is over the insulator layer 22 (and also over gate insulator 87), and extends towards the drain contact 75 (which is deposited in a later step and previously shown in FIG. 1). The extending portion 89 functions as a gate-connected field plate.

Figure 10:
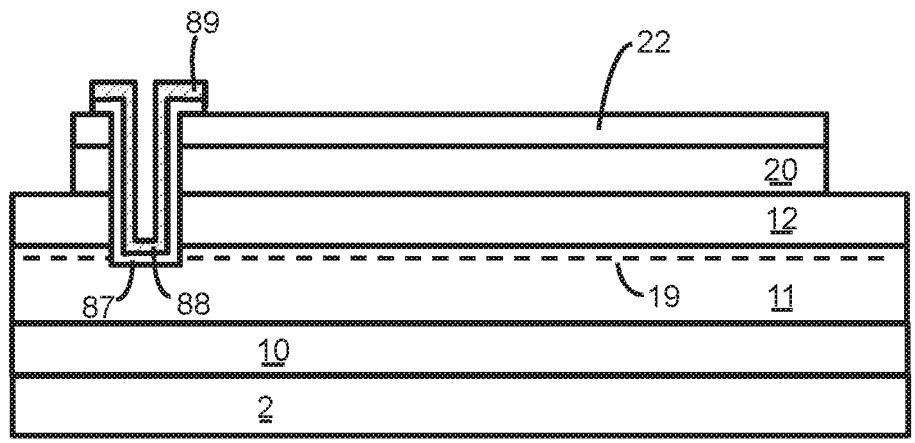
Figure 11:
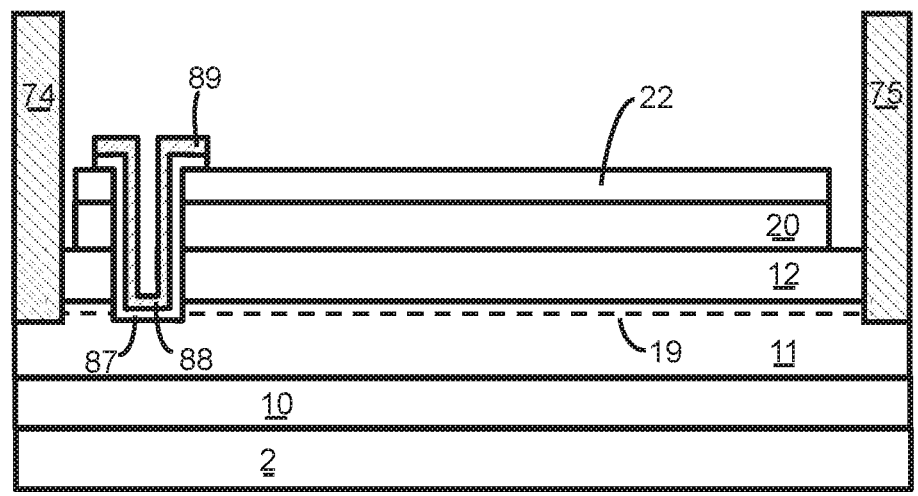

Next, as seen in FIG. 10, insulator layer 22 and graded III-N layer 20 are etched away in the source and drain contact regions, as well as in the access regions adjacent to the contact regions. Although not shown in FIG. 10, the etch process used to etch the graded III-N layer 20 can form a tapered sidewall near the drain contact region, where the taper forms an angle relative to a bottom surface of layer 20 that can be less than 45 degrees. Next, as seen in FIG. 11, source and drain contacts 74 and 75, respectively, are formed. The source and drain contacts are in electrical contact with the 2DEG 19 induced in the III-N material layers. As shown in FIG. 11, drain electrode 75 is formed so as to not directly contact the graded III-N layer 20, such that the drain electrode 75 and the graded III-N layer 20 are electrically isolated from one another.

Source and drain contacts 74 and 75, respectively, can be formed in a number of ways. For example, a metal or combination of metals can be deposited, for example by evaporation, sputtering, or CVD, in ohmic contact regions 85 and 86 (regions 85 and 86 are labeled in FIG. 1) upon the surface of layer 12, followed by a thermal anneal which results in the deposited metal forming a metallic alloy with the underlying semiconductor material. Alternatively, n-type dopants can be ion implanted into ohmic regions 85 and 86, followed by a metal deposition by evaporation, sputtering, or CVD, atop this region. Or the material in ohmic contact regions 85 and 86 can be etched away, and metal can then be deposited atop this region. Or the material in ohmic contact regions 85 and 86 can be etched away, n-type material can be regrown in this region (e.g., by MOCVD or MBE), and metal can then be deposited atop this region. In some implementations, the source and drain contacts are formed prior to etching the recess in the gate region and/or prior to forming the gate 88.

Figure 12:
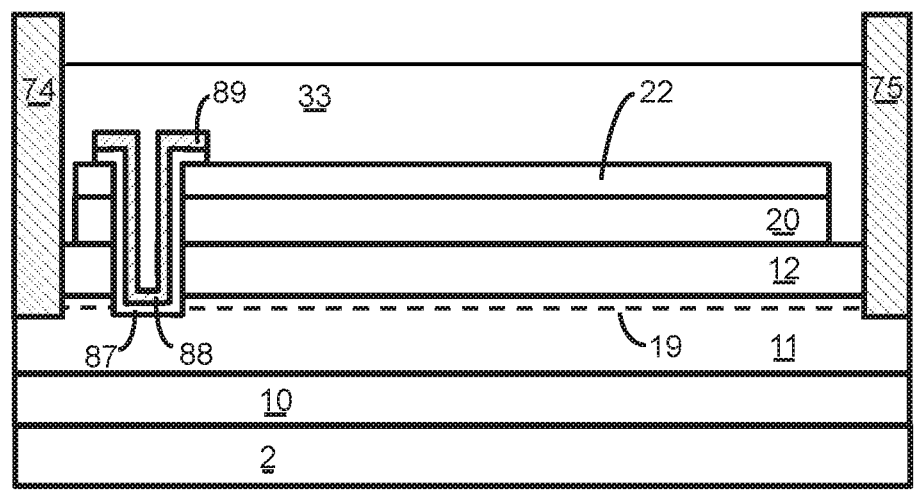
Figure 13:
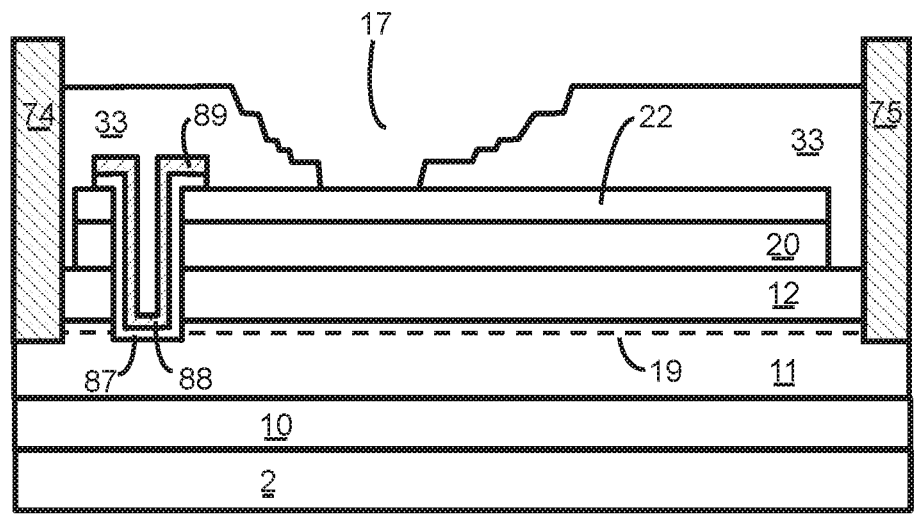

Next, as seen in FIG. 12, the electrode-defining layer 33 is deposited over insulator layer 22, for example by PECVD, sputtering, or evaporation. Recess 17 (shown in FIG. 13) is then formed as follows. Referring to FIG. 13, the surface of electrode-defining layer 33 on either side of the recess is covered with a masking material such as photoresist (not shown), and the electrode-defining layer 33 is etched to form recess 17, for example by reactive ion etching RIE or inductively coupled plasma (ICP) etching. Insulator layer 22 can be formed of a material that is not substantially etched by the etch procedure used to etch the recess in the electrode-defining layer 33. In such cases, the insulator layer 22 also functions as an etch stop layer, ensuring that the underlying III-N materials are not damaged by the etch. In some implementations, insulator layer 22 includes silicon nitride formed by MOCVD, and electrode-defining layer 33 includes silicon nitride formed by a different technique, for example PECVD. Due to the different densities of silicon nitride formed by these two techniques, it is possible to etch the electrode-defining layer 33 using an etch process that does not also etch the insulator layer 22.

Figure 14:
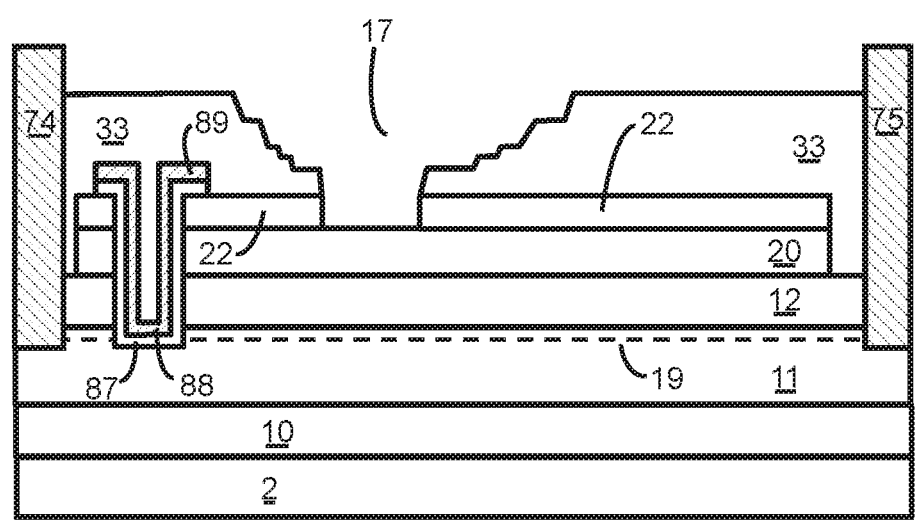

Referring to FIG. 14, after etching the recess 17 through the entire thickness of the electrode-defining layer 33, the portion of insulator layer 22 which is adjacent to the recess 17 is then removed, for example by performing an etch which etches the material of insulator layer 22 but does not etch the underlying III-N material.

Figure 15:
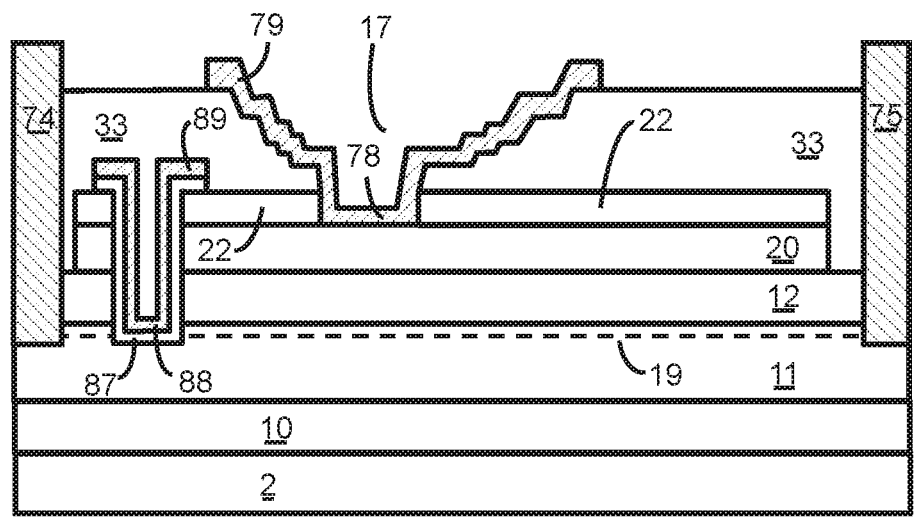
Figure 16:
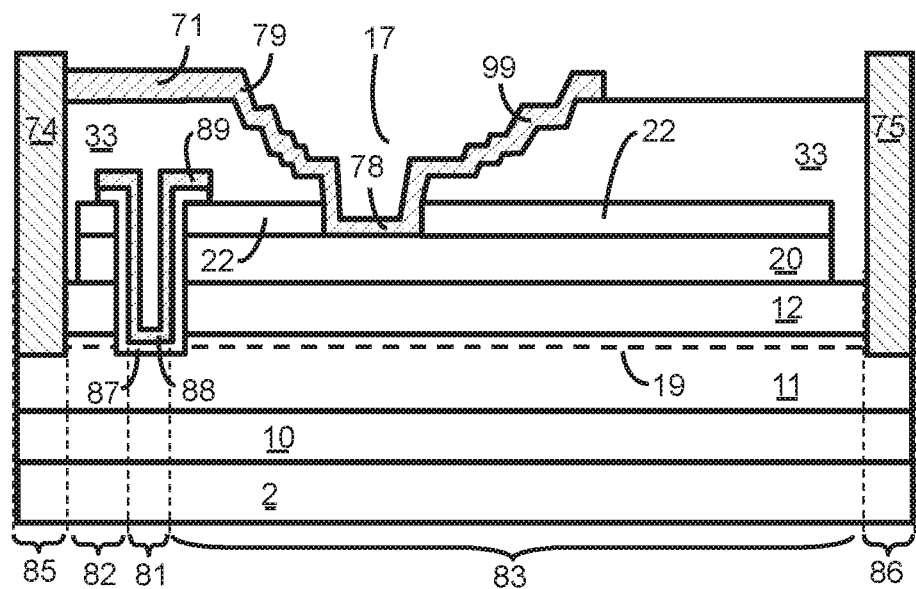

Next, as illustrated in FIG. 15, electrode 79 is deposited conformally in the recess, for example by evaporation, sputtering, or CVD. Finally, as seen in FIG. 16 (which is the same as FIG. 1), portion 71 of the field plate which connects the source contact 74 to the remainder of the field plate is formed, resulting in the transistor of FIG. 1. Alternatively, portion 71 may be formed in the same step as electrode 79.

Figure 17:
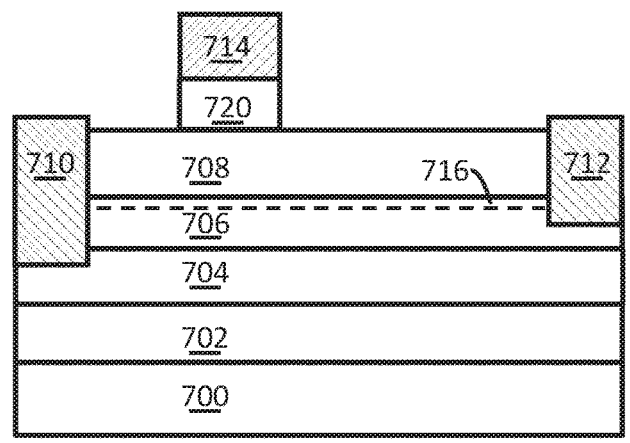
FIGS. 17-20 are cross-sectional views of partial or complete III-N transistor structures having graded III-N layers.
Figure 18:
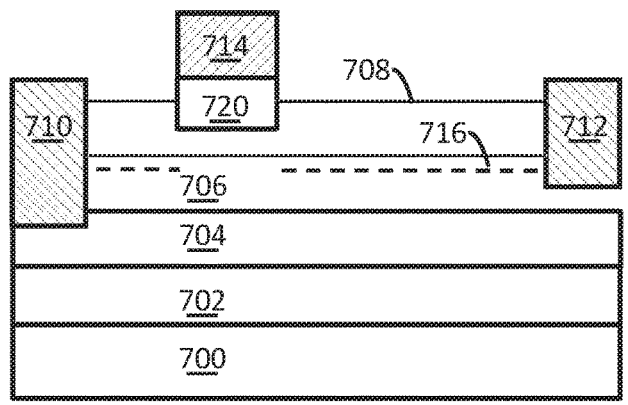

FIGS. 17 and 18 illustrate other transistor structures which incorporate a graded layer to deplete the device channel in the drain access region during OFF state bias and thereby operate similarly to that of FIG. 1. FIG. 17 illustrates a depletion-mode transistor, while FIG. 18 illustrates an enhancement-mode transistor. The devices of FIGS. 17 and 18 include a substrate 700, a III-N buffer layer 702, a graded III-N layer 704, a III-N channel layer 706, and a III-N barrier layer 708, where the composition and thickness of the barrier layer 708 are selected such that a 2DEG channel 716 is induced in the channel layer 706. As in the device of FIG. 1, the source 710 electrically contacts (i.e., is electrically connected to) the graded III-N layer 704, while the drain 712 is electrically isolated from the graded III-N layer 704. That is, as shown in FIGS. 17 and 18, the graded III-N layer 704 is below the III-N channel layer 706, and the source 710 extends through an entire thickness of the III-N channel layer 706 to contact the graded III-N layer 704, while the drain 712 does not extend through the entire thickness of the III-N channel layer 706, so that a portion of the III-N channel layer 706 is below the drain 712 and is between the drain 712 and the graded III-N layer 704, thereby preventing the drain 712 from being electrically connected to the graded III-N layer 704.

The graded III-N layer 704 has a composition that is graded, for example continuously graded, from the side adjacent the substrate 700 to the side opposite the substrate 700 (i.e., from the side opposite the channel layer 706 to the side adjacent the channel layer 706). The composition of the graded III-N layer 704 is selected such that the bandgap of the graded III-N layer 704 decreases (e.g., continuously decreases) from the side adjacent the substrate 700 to the side opposite the substrate 700, and/or the lattice constant of the graded III-N layer 704 increases (e.g., continuously increases) from the side adjacent the substrate 700 to the side opposite the substrate 700. For example, the graded III-N layer 704 can be formed of $Al_yGa_{1-y}N$ ($0 \leq y \leq 1$), where y decreases (e.g., continuously decreases) from the side adjacent the substrate 700 to the side opposite the substrate 700. Alternatively, the graded III-N layer 704 can be formed of $In_zGa_{1-z}N$ ($0 \leq z \leq 1$), where z increases (e.g., continuously increases) from the side adjacent the substrate 700 to the side opposite the substrate 700.

The III-N layers 702, 704, 706, and 708 can all be formed in a polar or semipolar orientation, for example a [0 0 0 1] or III-polar orientation (where the group-III face of the layer is opposite the substrate). The compositional grade in the graded III-N layer 704 causes the graded layer 704 to have a fixed negative polarization charge throughout the bulk of the layer. Specifically, because graded III-N layer is formed from a polar material in a polar orientation (e.g., a [0 0 0 1] orientation), compositionally grading the layer as described above causes a net negative polarization charge to exist in the bulk of the layer. These negative bulk polarization charges are electrically similar to ionized acceptors, and thus the graded layer 704 will be electrically neutral if it can attract holes at a concentration equal to the concentration of bulk polarization charge throughout the layer 704. The concentration of bulk polarization charge depends on the rate at which the material is graded; a higher rate of grading results in a higher concentration of polarization charge.

The specific grading structure and thickness of the graded III-N layer 704 is selected such that the 2DEG channel 716 in the device access regions is substantially populated with mobile charge while the device is biased in the ON state, but becomes depleted of charge when the device is biased in the OFF state, and a voltage greater than a minimum voltage level is applied to the drain, such that when the device is in the OFF state and blocks a sufficiently large voltage, the 2DEG in at least a portion of the device access regions is substantially depleted of mobile charge. For example, as with the device in FIG. 1, the areal hole density or the areal polarization charge density in the graded III-N layer 704 can be in the range of 10-100% (e.g., 50-75%) of the areal sheet charge density of the electrons in the 2DEG channel 716.

In some implementations, graded layer 704 is formed as a combination of multiple graded layers (provided the compositional grading throughout the entire graded layer is as described above). For example, graded III-N layer 704 can have the structure shown in FIG. 3 and previously described with reference to the device of FIG. 1. Such a structure has been found to allow for holes to be supplied to layer 704 via an overlying metal electrode (e.g., source 710) without requiring any p-type dopants in the III-N material structure.

Figure 19:
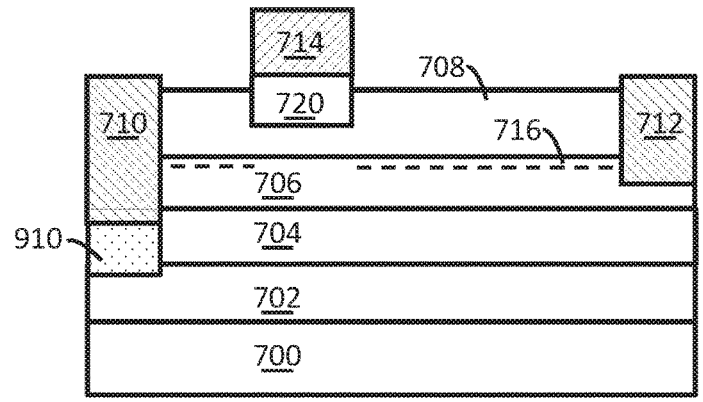

Alternatively, a p-type region can be provided which contacts graded layer 704 and provides holes to the layer. For example, FIG. 19 illustrates a device which is similar to that of FIG. 18 but also includes a p-doped region 910. The p-doped region 910 can, for example, be formed by ion implanting the III-N material beneath the source 710 with p-type dopants prior to depositing the source electrode material.

The devices of FIGS. 17-19 operate as follows. When the gate 714 is biased relative to the source 710 at a voltage that is greater than the threshold voltage of the device, there is 2DEG charge below the gate 714 in the gate region, and therefore a continuous 2DEG from the source 710 to the drain 712. When a positive voltage is applied to the drain 712, electrons flow from the source 710, through the continuous 2DEG channel 716, and into the drain 712. A conventional current flows from the drain 712 to the source 710, and the device is considered to be ON.

When the gate 714 is biased relative to the source 710 at a voltage that is lower than the threshold voltage of the device, there is no 2DEG in the gate region below the gate 714, and therefore the 2DEG is discontinuous between the source 710 and the drain 712. When a small positive voltage is applied to the drain 712 relative to the source, the portion of the 2DEG in the access region between the gate 714 and the drain 712 attains the same potential (i.e., the same voltage) as the drain 712. The graded layer 704 remains at substantially the same potential as the source 710, since the source 710 and the graded layer 704 are electrically connected as shown. As the voltage on the drain 712 is progressively increased, a positive electric field is created from the portion of the 2DEG in the drain-side access region down to the underlying portion of the graded layer 704 in the drain-side access region. This causes electrons from the portion of the 2DEG in the drain-side access region to become depleted, and the graded layer 704 in the drain-side access region is also progressively depleted of holes. Because the portion of the 2DEG 716 that is in the source-side access region remains at approximately the same voltage as the source, it does not become depleted of mobile carriers as the drain voltage increases when the device is biased in the OFF state. Similarly, the portion of the graded layer 704 in the source-side access region does not become depleted of holes as the drain voltage increases when the device is biased in the OFF state. Thus, even though the graded III-N layer 704 extends from the source region all the way to the drain region of the device, it only serves to deplete mobile charges from the 2DEG in the drain-side access region (and not the source-side access region) as the drain voltage increases when the device is biased in the OFF state.

The grading profile in the graded III-N layer 704, the layer thicknesses and compositions of the III-N layers, and the corresponding (undepleted) 2DEG sheet charge density in the channel can all be selected such that, at all voltages greater than a minimum drain voltage, where the minimum drain voltage can for example be in a range of 5V and 100V, almost all or substantially all mobile carriers in the 2DEG in the drain-side access region and in the graded III-N layer 704 become depleted (mobile carriers in the 2DEG include conduction electrons, and mobile carriers in the graded III-N layer 704 include holes). This results in a more uniform electric field and thus a larger average field before breakdown occurs, thereby resulting in a larger breakdown voltage.

Figure 20:
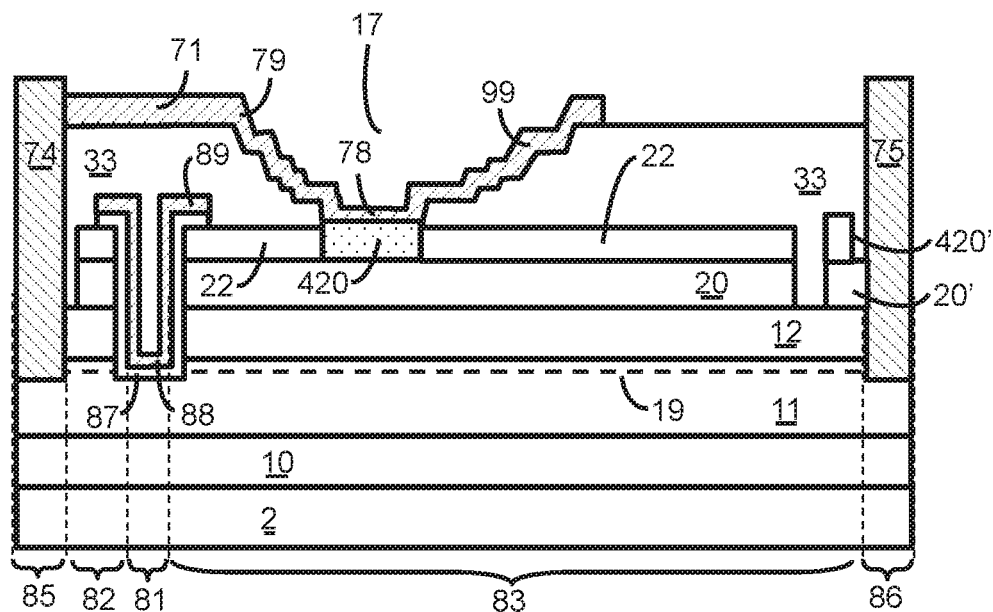

FIG. 20 illustrates yet another transistor structure which incorporates a graded layer to deplete the device channel in the drain access region during OFF state bias and thereby operate similarly to that of other transistors described herein. The device of FIG. 20 is similar to that of FIG. 4, but further includes a drain-connected p-doped III-N layer 420' which is electrically isolated from the graded III-N layer 20. The drain-connected p-doped III-N layer 420' contacts an additional graded III-N layer 20' which contacts the drain 75 and is also electrically isolated from the graded III-N layer 20, and the additional graded III-N layer 20' contacts the III-N barrier layer 12. In some implementations, layers 20 and 20' are grown simultaneously as a single layer, and a via is subsequently etched through the single layer to separate and electrically isolate layers 20 and 20' from one another. The drain-connected p-doped III-N layer 420' can allow holes to be injected from the drain contact into the device channel layer 11 during device operation, which can, for example, reduce the dynamic on-resistance of the device, thereby improving device performance. Although not shown in FIG. 20, the additional graded III-N layer 20' may optionally be omitted, in which case the drain-connected p-doped III-N layer 420' directly contacts the barrier layer 12.

Figure 21:
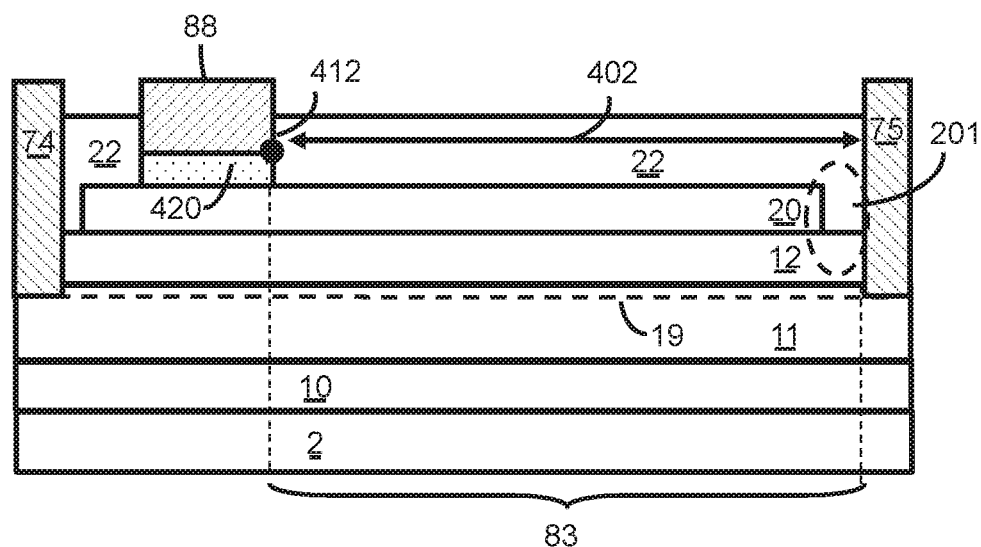
FIG. 21 is a cross-sectional view of a III-N depletion mode transistor having a gate contacting a p-doped layer which contacts a graded III-N layer.

FIG. 21 illustrates yet another embodiment of a III-N device which incorporates a graded layer to deplete the device channel in the drain access region 83 during OFF state bias. FIG. 21 is an example of a depletion mode transistor, where the device is ON when 0V is applied to the gate relative to the source and a sufficiently negative voltage must be applied to the gate relative to the source to turn the device OFF. The device of FIG. 21 is similar to the device of FIG. 4 in that the gate recess 18 (labeled in FIG. 6) extends through the insulating layer 22 but does not extend through the graded III-N layer 20.

The device of FIG. 21 shows a configuration which does not include the source connected field plate 79 shown in the device of FIG. 4. Here, the p-doped III-N layer 420 directly contacts and supplies holes to layer 20. The p-doped III-N layer 420 is doped with a hole concentration density greater than $1 \times 10^{18}$ holes/cm$^2$ such that it is substantially not depleted of holes when biased at or below the maximum rated voltage of the device. The p-doped III-N layer can be formed directly under and contacting the gate 88. The resistance between the gate 88 and the p-doped layer 420 is sufficiently small so as to not dominate the switching time of the device, and is preferably less than the resistance across p-doped layer 420 (i.e., the resistance between the top and bottom surfaces of layer 420).

Layer 420 can have similar length as the gate 88 or partially extend from beneath the gate towards the drain 75 (not shown) depending on process alignment and tolerances used during manufacturing. In order to minimize the separation 402 between the drain 75 and the gate 88, the distance the p-doped III-N layer 420 extends towards the drain 75 can be minimized. As viewed from above (plan view of the device), the area of layer 420 is less than (e.g., substantially less than) the area of layer 20. That is, layer 420 is only over and/or only covers a portion of the upper surface of layer 20. The gate 88 may optionally include an extending portion over the insulating layer 22 (not shown) similar to extending portion 89 as shown in the device of FIG. 4, which functions as a gate-connected field plate. The gate material which contacts the p-doped III-N layer 420 can be of a material such as Ni, Pt, TiN or other materials with a high work function.

Referring to region 201 of FIG. 21, the graded layer 20 can be separated from the drain 75 by including insulating material (e.g. insulator layer 22) between the two. Furthermore, the separation between drain 75 and layer 20 can, for example, be similar to those described in regards to region 201 of FIG. 2. When the device of FIG. 21 is biased in the OFF state, the holes are supplied to layer 20 via the p-doped III-N layer 420 and the required concentration of negative polarization charge in the graded layer 20 can be achieved with an abrupt heterojunction layer, for example an undoped GaN layer that has a bandgap that is less than the III-N barrier layer 12. However, hole trapping can occur at the interface of the III-N channel layer 12 and the abrupt heterojunction layer, causing a transient decrease in breakdown voltage and reduced device switching speed. This makes an abrupt heterojunction layer potentially less desirable than a graded III-N layer 20. Also, the graded III-N layer 20 can lower the interface resistance between the p-doped layer 420 and the graded III-N layer 20 compared to an abrupt GaN layer.

Furthermore, the peak electric field in the device of FIG. 21 while the device is biased in the OFF state occurs near the drain-side edge of p-doped III-N layer 420 (point 412 in FIG. 21). Because of the large voltage difference between the gate 88 and the drain 75 while the device is biased in the OFF state, the separation between the drain-side edge of gate 88 and the drain 75 must be sufficiently large to prevent breakdown when the device is biased in the OFF state and the voltage at the drain (relative to the source) is biased at any voltage up to the maximum rated voltage of the device. However, because of the spreading of the electric field provided by the depleted 2DEG channel 19 and depleted graded layer 20 in drain access region 83, the separation 402 can be much less than would otherwise be needed for a conventional device which lacks a layer (such as layer 20) that depletes the 2DEG channel in the drain access region during device OFF state operation. For example, if the device of FIG. 21 is designed (e.g., rated) to support a maximum steady-state voltage of 600V while the device is biased in the OFF state, separations 402 must typically be greater than about 7 µm, but can be less than 18 µm, less than 15 µm, less than 10 µm, or less than 8 µm. In conventional III-N devices in which the 2DEG channel in the drain access region is not fully depleted during OFF state device operation, the separation between the drain-side edge of the gate and the drain typically needs to be greater than 18 µm in order for the device to be able to support at least 600V while biased in the OFF state.

The device of FIG. 21 operates as follows. When the gate 88 is biased relative to the source 74 at a voltage that is greater than the threshold voltage of the device, there is a 2DEG channel from the source 74 to the drain 75. When a positive voltage is applied to the drain 75, electrons flow from the source 74, through the continuous 2DEG channel 19 and into the drain 75. A conventional current flows from the drain 75 to the source 74, and the device is considered to be ON.

When the gate 88 is biased relative to the source 74 at a voltage that is lower than the threshold voltage of the device, there is no 2DEG channel in the gate region below the gate 88, and therefore the 2DEG channel 19 is discontinuous between the source 74 and the drain 75. While no voltage (or a small voltage) is applied to the drain, the graded III-N layer 20 remains populated with holes that were supplied by the p-doped III-N layer 420. When a small positive voltage is applied to the drain 75, the portion of the 2DEG in the device access region between the gate 88 and the drain 75 attains substantially the same potential (i.e., substantially the same voltage) as the drain 75. The graded III-N layer 20 remains at substantially the same potential as the gate 88. As the voltage on the drain 75 is progressively increased, a positive electric field is created from the portion of the 2DEG in the drain side access region 83 that is directly beneath the graded III-N layer 20 up to the graded III-N layer 20. This causes electrons from the portion of the 2DEG in the drain-side access region to become depleted, and the graded III-N layer 20 is also progressively depleted of holes.

The grading profile in the graded III-N layer 20, the layer thicknesses and compositions of the III-N layers, and the corresponding (undepleted) 2DEG sheet charge density in the channel can all be selected such that, at all voltages greater than a minimum drain voltage, where the minimum drain voltage can for example be in a range of 20V and 100V, almost all or substantially all mobile carriers in the 2DEG in the drain-side access region 83 and in the graded III-N layer 20 deplete out (mobile carriers in the 2DEG include conduction electrons, and mobile carriers in the graded III-N layer 20 include holes). Because the graded III-N layer 20 is fully depleted, it no longer remains at the gate potential, and as a result the potential (i.e., voltage) in the layer increases (because the layer is no longer equipotential, different parts of the layer will be at different electric potentials). There is therefore a smooth change of potential from the drain 75 to the gate 88, and field peaking, which is commonly observed in conventional planar HEMTs, is mitigated at the edge of the field plate. This results in a more uniform electric field and thus a larger average field before breakdown occurs, thereby resulting in a larger breakdown voltage.

Figure 22A:
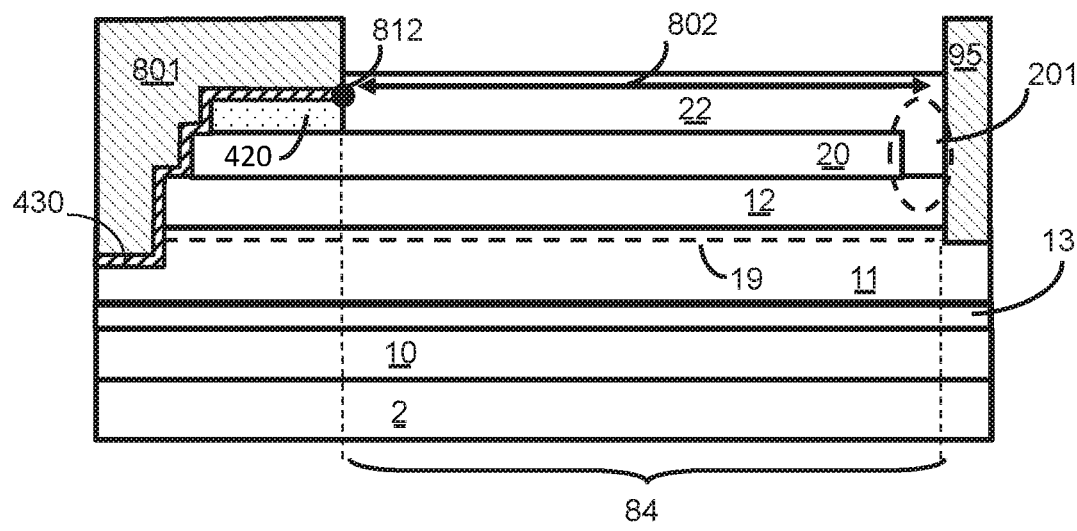
FIG. 22A is a cross-sectional view a two terminal III-N device which as a second terminal contacting a p-doped layer which contacts a graded III-N layer.

FIG. 22A illustrates yet another embodiment of a III-N device which incorporates a graded layer to deplete the device channel in a device access region 84 during OFF state bias. The device of FIG. 22A is a two terminal III-N device with two power electrodes and can operate as a III-N Schottky diode. The first power electrode 95 contacts the 2DEG channel 19 and can have the same properties as the drain 75 in the device of FIG. 1. The second power electrode 801 is formed in a recess that extends through the graded III-N layer 20, through the III-N barrier layer 12, through the 2DEG channel 19 and partially through the III-N channel layer 11. The second power electrode 801 can include two or more metal layers. The first metal layer, which contacts or is adjacent to the underlying III-N layers, forms a Schottky (rectifying) contact with the III-N layers. Preferably, the Schottky barrier height is as large as required in order to reduce the reverse bias leakage currents to the level desired. A layer of Ni, Pt or TiN is commonly used for the first contacting metal layer. The remaining metal layers atop the first metal layer are typically thick and have a large electrical conductivity (e.g. Au, Cu or Al), in order to reduce lateral resistances in the second power electrode 801. When the device of FIG. 22A is biased in the off state, holes are supplied to layer 20 via the p-doped III-N layer 420 and the required concentration of negative polarization charge in the graded layer 20 can be achieved with an abrupt heterojunction layer, for example an undoped GaN layer that has a bandgap that is less than the III-N barrier layer 12. However, hole trapping can occur at the interface of the III-N channel layer 12 and the abrupt heterojunction layer, causing a transient decrease in breakdown voltage and reduced device switching speed. This makes an abrupt heterojunction layer potentially less desirable than a graded III-N layer 20. Also, the graded III-N layer 20 can lower the interface resistance between the p-doped layer 420 and the graded III-N layer 20 compared to an abrupt GaN layer.

Prior to forming the second power electrode 801 in the recess, an optional p-doped barrier enhancement III-N layer 430 can be deposited conformally along the sidewalls of the recess. This barrier enhancement layer 430 can be formed between the electrode 801 and the underlying III-N layers in the recess. The barrier enhancement layer 430 can act to enhance the Schottky barrier height between power electrode 801 and the underlying layers, thereby further reducing reverse bias currents during device operation. The barrier enhancement layer 430 can be formed via a regrowth step after etching the recess in which electrode 801 is deposited. The regrowth of this III-N layer 430 after etching the recess helps to repair damage caused by the etch process and decreases current leakage paths through the Schottky contact. Reverse bias leakage current can be 10 times or greater in a device which is formed without the barrier enhancement layer. The p-doped barrier enhancement layer 430 can have characteristics such that a combination of the thickness and the p-doping density (e.g. less than $1\times10^{18}$ holes/cm$^2$) causes the layer to be fully depleted of holes under forward and reverse bias conditions, thereby allowing the device to operate as a Schottky diode. Alternatively, the p-doped barrier enhancement layer 430 can have characteristics such that the layer is not depleted of holes under forward or reverse bias conditions, and the III-N device can function as a p-n junction diode. Or, the thickness and doping density of the p-doped barrier enhancement layer 430 can be selected such that holes are present during forward bias operation, but the barrier enhancement layer is fully depleted of holes during reverse bias operation, and the device can operate like a hybrid device with both Schottky and p-n junction diode characteristics.

The device of FIG. 22A can optionally be formed with a III-N back barrier layer 13. The back barrier layer 13 can have similar properties as the III-N barrier layer 12 and serves to confine the holes injected into the channel 19 from the p-doped II-N layer 420. The back barrier layer 13 should be less than 100 nm from the 2DEG channel 19 but sufficiently far from the 2DEG so as not to increase the sheet resistance of the 2DEG channel 19 by more than 50%. The back barrier layer 13 should be formed with properties such that a 2DEG channel is not formed on the n-polar side of the back barrier layer adjacent to the buffer layer 10.

Furthermore, the peak electric field in the device of FIG. 22A while the device is biased in the OFF state occurs near the first power electrode-side edge of the p-doped III-N layer 420 (point 812 in FIG. 22A). Because of the large voltage difference between the first power electrode 95 and the second power electrode 801 while the device is biased in the OFF state, the separation between the first power electrode 95 and the second power electrode 801 must be sufficiently large to prevent breakdown when the device is biased in the OFF state and the voltage at the first power electrode (relative to the second power electrode) is biased at any voltage up to the maximum rated voltage of the device. However, because of the spreading of the electric field provided by the depleted 2DEG channel 19 and depleted graded layer 20 in device access region 84, the separation 802 is much less than would otherwise be needed for a conventional device which lacks a layer (such as layer 20) that depletes the 2DEG channel in the device access region during device OFF state operation. For example, if the device of FIG. 22A is designed (e.g., rated) to support a maximum steady-state voltage of 600V while the device is biased in the OFF state, separations 802 must typically be greater than about 7 µm, but can be less than 18 µm, less than 15 µm, less than 10 µm, or less than 9 µm. In conventional III-N devices in which the 2DEG channel in the device access region is not fully depleted during OFF state device operation, the separation between the first power electrode and the second power electrode typically needs to be greater than 18 µm in order for the device to be able to support at least 600V while biased in the OFF state.

The device of FIG. 22A operates as follows. When the voltage at the second power electrode 801 is less than that of the first power electrode 95, such that the Schottky junction between the second power electrode 801 and the III-N layer 12 is reversed bias, the device is in the OFF state. When a small positive voltage is applied to the first power electrode 95, the portion of the 2DEG in the device access region 84 attains substantially the same potential as the first power electrode 95. The graded III-N layer 20 remains at substantially the same potential as the second power electrode 801. As the voltage on the first power electrode 95 is progressively increased, a positive electric field is created from the portion of the 2DEG in the device access region 84 that is directly beneath the graded III-N layer 20 up to the graded III-N layer 20. This causes electrons from the portion of the 2DEG in the device access region to become depleted, and the graded III-N layer 20 is also progressively depleted of holes.

As the voltage at the second power electrode 801 is increased to greater than a first threshold voltage of the device relative to the first power electrode 95, the Schottky junction between the power electrodes becomes forward bias, and the device is in the ON state. In this state, a substantial electron current flows from the first power electrode through the 2DEG channel 19 and into the second power electrode 801. As the voltage is further increased at the second power electrode 801 beyond a second threshold voltage, the p-i-n junction that exists between the p-doped layer 420 and the III-N channel layer 11 turns on and additional holes are injected into the channel 19. In order to maintain a space charge balance, additional electrons are imaged on the channel 19. The III-N back barrier layer 13 serves to confine some of the additional holes in a potential well formed at the interface of the back barrier layer 12 and the III-N channel layer 11. This adds surge protection to the device when biased beyond the p-i-n junction turn-on voltage by increasing the charge density of the channel 19.

The grading profile in the graded III-N layer 20, the layer thicknesses and compositions of the III-N layers, and the corresponding (undepleted) 2DEG sheet charge density in the channel can all be selected such that, at all voltages greater than a minimum drain voltage, where the minimum drain voltage can for example be in a range of 5V and 100V, almost all or substantially all mobile carriers in the 2DEG in the device access region 84 and in the graded III-N layer 20 deplete out (mobile carriers in the 2DEG include conduction electrons, and mobile carriers in the graded III-N layer 20 include holes). Because the graded III-N layer 20 is fully depleted, it no longer remains at the second power electrode potential, and as a result the potential (i.e., voltage) in the layer increases (because the layer is no longer equipotential, different parts of the layer will be at different electric potentials). There is therefore a smooth change of potential from the first power electrode 95 to the second power electrode 801, and field peaking, which is commonly observed in conventional planar devices is mitigated at the edge of the second power electrode. The result is a more uniform electric field and thus a larger average field before breakdown occurs, thereby allowing for a larger breakdown voltage.

Figure 22B:
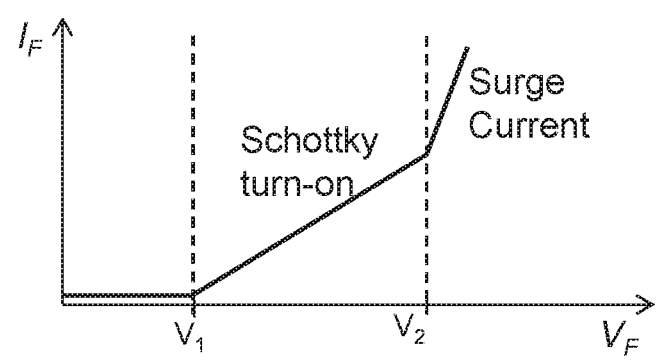
FIG. 22B is a graph which illustrates the forward bias voltage vs. current behavior of the device of FIG. 22A.

FIG. 22B is a graph which shows how the forward bias current (IF) increases as the Schottky junction turns on at a forward bias voltage (VF) greater than a first voltage ($V_1$) related to the Schottky barrier height. As the forward bias voltage increases beyond a second voltage (V2), the p-i-n junction that exists between the p-doped III-N layer 420 and the III-N channel layer 11 turns on, and the forward bias current (IF) increases at an accelerated rate from the surge current provided to the device.

Figure 23:
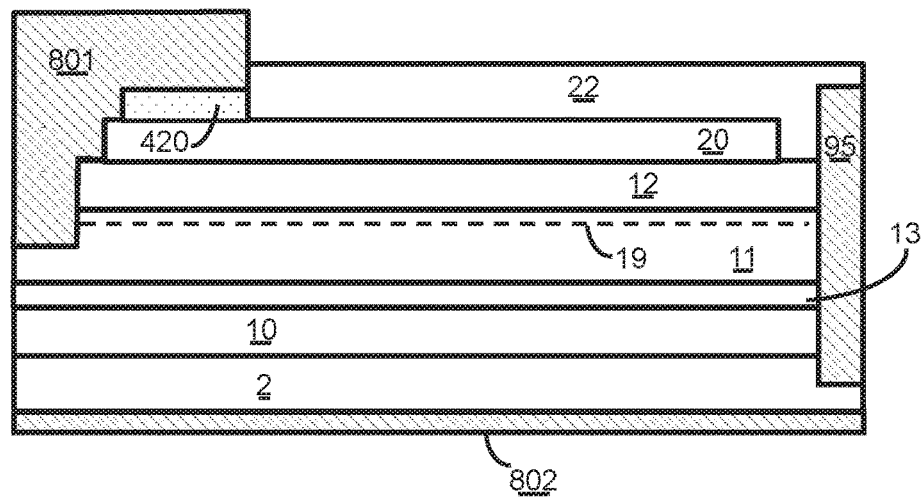
FIG. 23 is a cross-sectional view of a two terminal III-N device which has a first terminal electrically connected to a substrate.

FIG. 23 is another embodiment of a III-N devices which is similar to the device in FIG. 22A except that the first power electrode 95 is electrically connected to the substrate 2. Prior to forming the first power electrode 95, an etch process can be used to remove the III-N layers above the substrate 2 forming a via through the device. Next, metal can be deposited in the via, electrically connecting to the substrate 2 and the 2DEG channel 19 forming the first power electrode 95. Insulating layer 22 can be formed over the first power electrode 95 to encapsulate it from the external environment, or alternatively, it can be left exposed. A back side metal layer 802 can be deposited on the substrate 2 opposite the III-N buffer layer 10. Power electrode 801 can be used as a first terminal and backside metal layer 802 can be used as a second terminal, creating a vertically integrated two terminal device used for simplified packaging.

Figure 24:
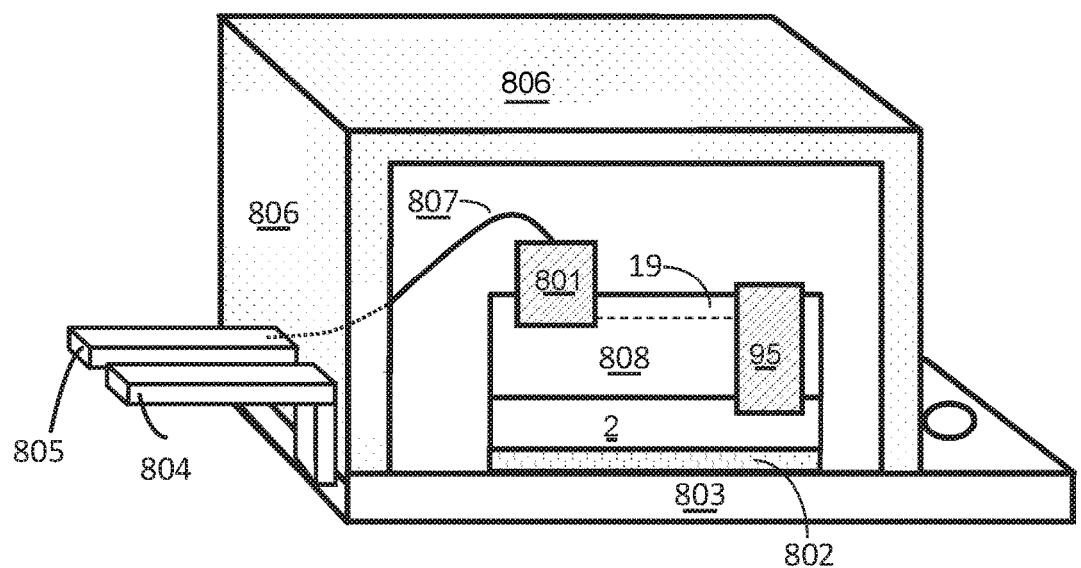
FIG. 24 is an example package configuration of the device of FIG. 23.

FIG. 24 is an example of the device of FIG. 23 assembled in a package configuration. The III-N layer structure 808 contains the 2DEG channel 19 which connects the first power electrode 95 to the second power electrode 801. The package 806 has a first lead 804 and a second lead 805. The first lead 804 is electrically connected to a conductive structural package base 803. The second lead 805 is electrically isolated from the conductive structural package base 803. Metal layer 802 under the substrate 2 can be directly mounted or soldered to the conductive structural package base 803, and power electrode 801 can be electrically connected via a wire 807 to the second lead 805 of the package. This is a simplified package design of a two terminal vertical III-N device compared to traditional lateral III-N device.

A number of implementations have been described. Nevertheless, it will be understood that various modifications may be made without departing from the spirit and scope of the techniques and devices described herein. For example, in any of the devices described herein, the interface between the III-N channel layer and the III-N barrier layer may be non-abrupt (i.e., may be graded over some finite distance such as between 0.5 nm and 10 nm), or alternatively the III-N channel layer and the III-N barrier layer can be replaced by a single layer whose bandgap is graded in an opposite direction from that of the graded III-N layer. In either of these cases, the induced channel charge can exist over all or part of the non-abrupt (e.g., graded) region. Accordingly, other implementations are within the scope of the following claims.

What is claimed is:

1. A III-N device comprising:
a III-N layer structure comprising
a III-N channel layer,
a 2DEG channel in, and a III-N barrier layer over, the III-N channel layer, and
a graded III-N layer over the III-N barrier layer, the graded III-N layer having a first side adjacent to the III-N barrier layer and a second side opposite the first side;
a first power electrode and a second power electrode; and
a gate between the first power electrode and the second power electrode, the gate being over the III-N layer structure;
wherein a composition of the graded III-N layer is graded such that a bandgap of the graded III-N layer adjacent to the first side is greater than the bandgap of the graded III-N layer adjacent to the second side;
wherein the graded III-N layer includes a device access region that is (i) between the gate and the second power electrode, and (ii) electrically connected to the first power electrode and electrically isolated from the second power electrode;
wherein the III-N device has a threshold voltage and
wherein the III-N device is configured such that
when the gate is biased relative to the first power electrode at a voltage greater than the threshold voltage, the 2DEG channel extends continuously from the first power electrode to the second power electrode and
when the gate is biased relative to the first power electrode at a voltage less than the threshold voltage and the second power electrode is biased relative to the first power electrode at a positive voltage that is less than a minimum voltage, the 2DEG is depleted of mobile charge in a gate region of the III-N device.

2. The III-N device of claim 1, wherein the III-N device is configured such that when the gate is biased relative to the first power electrode at a voltage less than the threshold voltage and the second power electrode is biased relative to the first power electrode at a positive voltage that is greater than the minimum voltage, the 2DEG is depleted of mobile charge in the device access region between the gate and the second power electrode.

3. The III-N device of claim 2, wherein the minimum voltage is 5V or larger.

4. The III-N device of claim 2, wherein the minimum voltage is in a range of 5V to 100V.

5. A III-N device comprising:
a III-N layer structure comprising
a III-N channel layer,
a 2DEG channel in, and a III-N barrier layer over, the III-N channel layer, and
a graded III-N layer over the III-N barrier layer, the graded III-N layer having a first side adjacent to the III-N barrier layer and a second side opposite the first side;
a first power electrode and a second power electrode; and
a gate between the first power electrode and the second power electrode, the gate being over the III-N layer structure;
wherein a composition of the graded III-N layer is graded such that a bandgap of the graded III-N layer adjacent to the first side is greater than the bandgap of the graded III-N layer adjacent to the second side;
wherein the graded III-N layer includes a device access region that is (i) between the gate and the second power electrode, and (ii) electrically connected to the first power electrode and electrically isolated from the second power electrode; and wherein a grading profile of the graded III-N layer is such that a polarization charge density in the graded III-N layer is in a range of 10-100% of an areal sheet charge density of mobile charge in the 2DEG channel.

6. The III-N device of claim 5, the III-N device having a threshold voltage, wherein a grading profile of the graded III-N layer is such that mobile charge in the 2DEG channel in the device access region between the gate and the second power electrode is depleted while the gate is biased relative to the first power electrode at a voltage lower than the threshold voltage and the second power electrode is biased above a minimum voltage relative to the first power electrode, but not depleted while the gate is biased relative to the first power electrode at a voltage higher than the threshold voltage.

7. The III-N device of claim 5, further comprising a recess extending through the graded III-N layer, wherein the gate is in the recess.

8. The III-N device of claim 5, further comprising a field plate which is connected to the first power electrode and directly contacts a surface of the graded III-N layer that is between the gate and the second power electrode.

9. The III-N device of claim 5, the III-N device having a threshold voltage, wherein a grading profile of the graded III-N layer is such that mobile charge in the 2DEG channel in the device access region between the gate and the second power electrode is depleted while the gate is biased relative to the first power electrode at a voltage lower than the threshold voltage and the second power electrode is biased above a minimum voltage relative to the first power electrode, but not depleted while the gate is biased relative to the first power electrode at a voltage lower than the threshold voltage and the second power electrode is biased below the minimum voltage relative to the first power electrode.

10. The III-N device of claim 9, wherein the minimum voltage is in a range of 5V to 100V.

11. A III-N device comprising: of claim 1,
a III-N layer structure comprising
a III-N channel layer,
a III-N barrier layer over the III-N channel layer, and
a graded III-N layer over the III-N barrier layer, the graded III-N layer having a first side adjacent to the III-N barrier layer and a second side opposite the first side;
a first power electrode and a second power electrode; and
a gate between the first power electrode and the second power electrode, the gate being over the III-N layer structure;
wherein a composition of the graded III-N layer is graded such that a bandgap of the graded III-N layer adjacent to the first side is greater than the bandgap of the graded III-N layer adjacent to the second side;
wherein the graded III-N layer includes a device access region that is (i) between the gate and the second power electrode, and (ii) electrically connected to the first power electrode and electrically isolated from the second power electrode; and
wherein the graded III-N layer comprises a first graded III-N layer adjacent to the first side and a second graded III-N layer adjacent to the second side, wherein the first graded III-N layer is thicker than the second graded III-N layer.

12. The III-N device of claim 11, wherein the first graded III-N layer is at least three times thicker than the second graded III-N layer.

13. The III-N device of claim 11, wherein a bandgap of the first graded III-N layer is graded at a first rate, and a bandgap of the second graded III-N layer is graded at a second rate, the second rate being greater than the first rate.

14. The III-N device of claim 13, wherein the second rate is at least five times greater than the first rate.

15. A transistor comprising:
a III-N layer structure comprising a III-N channel layer, a III-N barrier layer over the III-N channel layer, a first graded III-N layer over the III-N barrier layer, and a second graded III-N layer over the first graded III-N layer, the second graded III-N layer being thinner than the first graded III-N layer;
a source electrode and a drain electrode;
a gate between the source electrode and the drain electrode, the gate being over the III-N layer structure; and
a field plate that is electrically connected to the source electrode and contacts a surface of the second graded III-N layer between the gate and the drain electrode; wherein
the first graded III-N layer has a first side adjacent to the III-N barrier layer and a second side opposite the first side, and the second graded III-N layer has a third side adjacent to the first graded III-N layer and a fourth side opposite the third side;
a composition of the first graded III-N layer is graded at a first average rate from the first side to the second side such that a bandgap of the first graded III-N layer at the first side is greater than the bandgap of the first graded III-N layer at the second side;
a composition of the second graded III-N layer is graded at a second average rate from the third side to the fourth side such that the bandgap of the second graded III-N layer at the third side is greater than the bandgap of the second graded III-N layer at the fourth side; and
the second average rate is greater than the first average rate.

16. The transistor of claim 15, wherein the second graded III-N layer is electrically isolated from the drain electrode.

17. The transistor of claim 15, wherein the second graded III-N layer does not directly contact the drain electrode.

18. A III-N device, comprising:
a III-N layer structure comprising a III-N barrier layer adjacent to a III-N channel layer, wherein a compositional difference between the III-N channel layer and the III-N barrier layer causes a 2DEG channel to be induced in the III-N channel layer;
a first power electrode and a second power electrode, wherein the first and second power electrodes are electrically connected to the 2DEG channel;
a gate electrode over the III-N channel layer and between the first power electrode and the second power electrode;
a graded III-N layer over the III-N layer structure and between the gate electrode and the second power electrode, the graded III-N layer having a first side adjacent to the III-N layer structure and a second side opposite the first side; and
a p-doped III-N layer over the graded III-N layer, the p-doped III-N layer having a third side contacting the second side of the graded III-N layer and a fourth side opposite the third side;

wherein the p-doped III-N layer and the graded III-N layer are electrically isolated from the second power electrode;
a composition of the graded III-N layer is graded such that a bandgap of the graded III-N layer adjacent to the first side is greater than the bandgap of the graded III-N layer adjacent to the second side; and
an area of the third side of the p-doped III-N layer is less than an area of the second side of the graded III-N layer.

19. The III-N device of claim 18, further comprising a field plate that is electrically connected to the first power electrode and contacts a surface of the p-doped III-N layer between the gate electrode and the second power electrode.

20. The III-N device of claim 18, wherein the graded III-N layer and the p-doped layer each include a first edge adjacent to the gate electrode and a second edge opposite the first edge, and wherein a separation between the gate electrode and the second edge of the graded III-N layer is greater than a separation between the gate electrode and the second edge of the p-doped III-N layer.

21. The III-N device of claim 20, wherein a separation between the second power electrode and the second edge of the p-doped III-N layer is greater than a separation between the second power electrode and the second edge of the graded III-N layer.

22. A transistor, comprising:
a III-N layer structure comprising a III-N channel layer between a III-N barrier layer and a graded III-N layer;
a source and a drain;
a gate between the source and the drain, the gate being over the III-N layer structure; and
a channel in the III-N channel layer, the channel extending from the source to the drain when the gate is biased relative to the source at a voltage which is higher than a threshold voltage of the transistor; wherein
the graded III-N layer is electrically connected to the source and electrically isolated from the drain.

23. The transistor of claim 22, wherein the channel is between the graded III-N layer and the gate.

24. The transistor of claim 22, wherein a portion of the III-N channel layer is below the drain and is between the drain and the graded III-N layer.

* * * * *

UNITED STATES PATENT AND TRADEMARK OFFICE
CERTIFICATE OF CORRECTION

PATENT NO. : 10,224,401 B2
APPLICATION NO. : 15/564498
DATED : March 5, 2019
INVENTOR(S) : Umesh Mishra et al.

Page 1 of 1

It is certified that error appears in the above-identified patent and that said Letters Patent is hereby corrected as shown below:

In the Claims

Column 22, Line 24, Claim 1: delete "voltage" and insert --voltage;--, therefor.

Column 22, Line 30, Claim 1: delete "electrode" and insert --electrode,--, therefor.

Column 23, Line 42, Claim 11: after "comprising:" delete "of claim 1,".

Signed and Sealed this
Thirtieth Day of April, 2019

Andrei Iancu
*Director of the United States Patent and Trademark Office*